(12) United States Patent
Yang et al.

(10) Patent No.: US 11,430,779 B2
(45) Date of Patent: Aug. 30, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jaewan Yang, Suwon-si (KR); Wootae Kim, Seoul (KR); Hyungock Kim, Seoul (KR); Sangdo Park, Yongin-si (KR); Jun Seomun, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 15 days.

(21) Appl. No.: 17/028,855

(22) Filed: Sep. 22, 2020

(65) Prior Publication Data

US 2021/0134785 A1 May 6, 2021

(30) Foreign Application Priority Data

Nov. 4, 2019 (KR) .................. 10-2019-0139770
Apr. 29, 2020 (KR) .................. 10-2020-0052247

(51) Int. Cl.
| | | |
|---|---|---|
| H01L 27/02 | (2006.01) | |
| H01L 21/768 | (2006.01) | |
| H01L 27/088 | (2006.01) | |
| H01L 23/522 | (2006.01) | |

(52) U.S. Cl.
CPC .... *H01L 27/0207* (2013.01); *H01L 21/76895* (2013.01); *H01L 23/5226* (2013.01); *H01L 27/0886* (2013.01)

(58) Field of Classification Search
CPC ............ H01L 27/0207; H01L 27/0886; H01L 21/76895; H01L 23/5226
USPC ......................................................... 257/401
See application file for complete search history.

(56) References Cited

U.S. PATENT DOCUMENTS

| | | | |
|---|---|---|---|
| 6,013,536 A | * | 1/2000 | Nowak ................. H01L 23/528 257/E23.151 |
| 7,765,510 B2 | | 7/2010 | Ohtsuka |
| 8,981,562 B2 | | 3/2015 | Chuang et al. |
| 9,477,803 B2 | | 10/2016 | Wang et al. |
| 10,204,203 B2 | | 2/2019 | Lin et al. |
| 2010/0037197 A1 | | 2/2010 | Fukunaga |

FOREIGN PATENT DOCUMENTS

| | | |
|---|---|---|
| JP | 5400345 B2 | 11/2013 |
| KR | 20190037046 A | 4/2019 |

* cited by examiner

*Primary Examiner* — Tu-Tu V Ho
(74) *Attorney, Agent, or Firm* — Myers Bigel, P.A.

(57) ABSTRACT

Disclosed are a semiconductor device and a method of fabricating the same. The method includes placing a standard cell, resizing a power via pattern in such a way that the power via pattern has a different width from a width of other via pattern, and applying different design rules to the power via pattern and the other via pattern, respectively, to perform a routing operation on the standard cell.

20 Claims, 26 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application Nos. 10-2019-0139770 and 10-2020-0052247, filed on Nov. 4, 2019 and Apr. 29, 2020, respectively, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

Due to their small-size, multifunctional, and/or low-cost characteristics, semiconductor devices are considered important elements in the electronics industry. Semiconductor devices are classified into semiconductor memory devices for storing data, semiconductor logic devices for processing data, and hybrid semiconductor devices including both of memory and logic elements. As the electronics industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the inventive concept provides a semiconductor device, in which field effect transistors with improved electric characteristics are provided, and a method of fabricating the same.

According to an embodiment of the inventive concept, a method of fabricating a semiconductor device may include placing a standard cell. The standard cell may include a first lower interconnection pattern, a second lower interconnection pattern, a lower power pattern, a first upper interconnection pattern, a second upper interconnection pattern, an upper power pattern, a first via pattern between the first lower interconnection pattern and the first upper interconnection pattern, a second via pattern between the second lower interconnection pattern and the second upper interconnection pattern, and a third via pattern between the lower power pattern and the upper power pattern. A width of the second via pattern may be larger than a width of the first via pattern, and a first width of the third via pattern may be equal to a width of the second via pattern. The method may further include resizing the third via pattern in such a way that the third via pattern has a second width that is different from the width of the second via pattern, and applying different design rules to the second via pattern and the third via pattern, respectively, to perform a routing operation on the standard cell.

According to an embodiment of the inventive concept, a method of fabricating a semiconductor device may include placing an upper power pattern, placing a standard cell on the upper power pattern, placing a power via pattern between the upper power pattern and a lower power pattern of the standard cell, resizing the power via pattern to differentiate the power via pattern from another via pattern, and performing a routing operation on the standard cell.

According to an embodiment of the inventive concept, a semiconductor device may include a logic cell, which includes an active pattern and a gate electrode crossing the active pattern and extending in a first direction, on a substrate, a first metal layer on the logic cell, and a second metal layer on the first metal layer. The first metal layer may include a lower interconnection line, which is electrically connected to at least one of the active pattern and the gate electrode, and a lower power line, which is provided on a boundary of the logic cell and is extended in a second direction. The second metal layer may include an upper interconnection line, which is electrically connected to the lower interconnection line, an upper power line, which is electrically connected to the lower power line, an upper via between the lower interconnection line and the upper interconnection line, and an upper power via between the lower power line and the upper power line. A metal layer, which has the largest volume among the upper power via, may include a metallic material different from a metal layer, which has the largest volume among the upper via.

DETAILED DESCRIPTION

Figure 1:
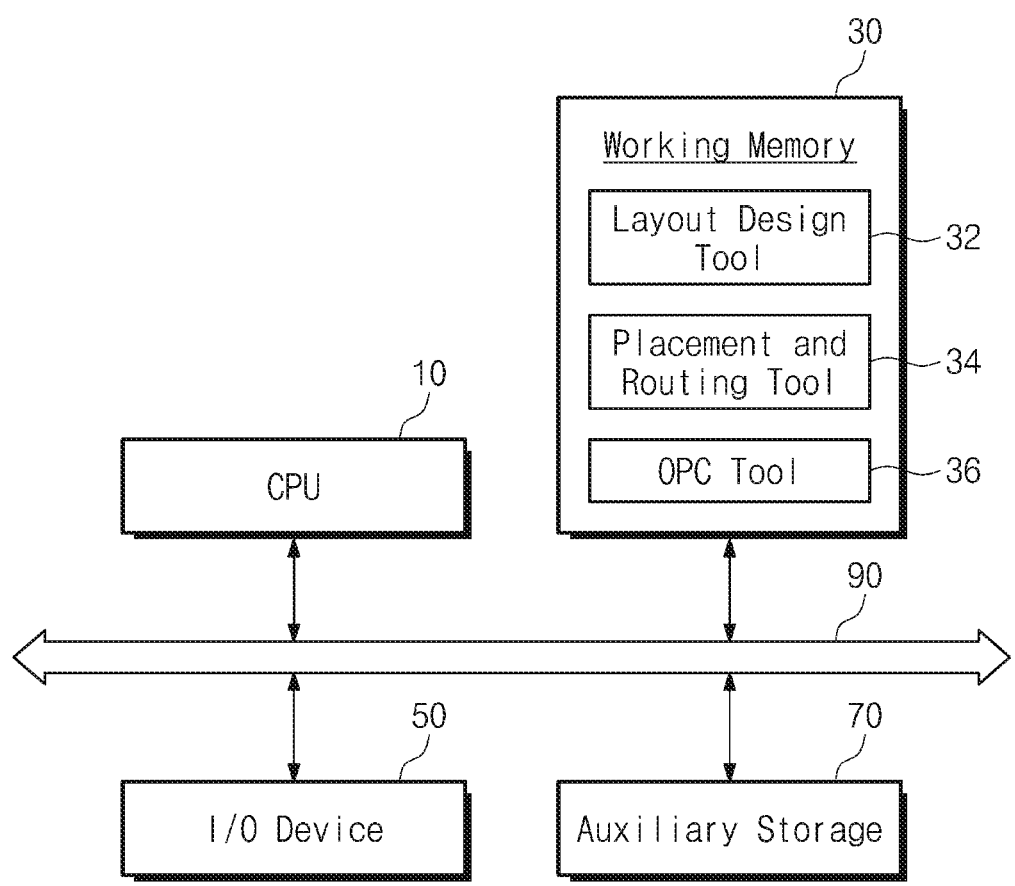
FIG. 1 is a block diagram illustrating a computer system which is configured to execute a semiconductor design process, according to an embodiment of the inventive concept.

FIG. 1 is a block diagram illustrating a computer system which is configured to execute a semiconductor design process, according to an embodiment of the inventive concept. Referring to FIG. 1, a computer system may include a processing unit (CPU) 10, a working memory 30, an input-output device 50, and an auxiliary storage (i.e., memory) device 70. In an embodiment, the computer system may be provided in the form of a customized system, which is configured to execute a layout design process according to the inventive concept. Furthermore, the computer system may be configured to carry out various design and check simulation programs.

The CPU 10 may be configured to run a variety of software programs, such as application programs, operating systems, and device drivers, which are executed on the computer system. The CPU 10 may run an operating system loaded on the working memory 30. Furthermore, the CPU 10 may run various application programs, which are executed based on the operating system. For example, the CPU 10 may run a layout design tool 32, a placement and routing tool 34, and/or an optical proximity correction (OPC) tool 36, which are loaded on the working memory 30.

The operating system or the application programs may be loaded on the working memory 30. For example, when the computer system starts a booting operation, an image of the operating system (not shown) stored in the auxiliary memory device 70 may be loaded on the working memory 30 in accordance with a predetermined booting sequence. In the computer system, the overall input/output operations may be managed by the operating system. Similarly, some application programs, which are selected by a user or are provided for basic services, may be loaded on the working memory 30.

The layout design tool 32, which is used for a layout design process, may be loaded on the working memory 30 from the auxiliary memory device 70. The placement and routing tool 34, which is used to place the designed standard cells and to route the placed standard cells, may be loaded on the working memory 30 from the auxiliary memory device 70. The OPC tool 36, which is used to execute an OPC process on the designed layout data, may be loaded on the working memory 30 from the auxiliary memory device 70.

The layout design tool 32 may be configured to change biasing data for some layout patterns; for example, the layout design tool 32 may be configured to allow the specific layout patterns to have shapes and positions different from those given by a design rule. Furthermore, the layout design tool 32 may be configured to execute a design rule check (DRC) operation, under the conduction of the changed bias data. The working memory 30 may be one of volatile memory devices (e.g., static or dynamic random access memory (SRAM or DRAM) devices) or nonvolatile memory devices (e.g., PRAM, MRAM, ReRAM, FRAM, and NOR FLASH memory devices).

The input-output device 50 may be configured to control a user's input and output data through user interface devices. For example, the input-output device 50 may include a keyboard or a monitor, which are used to receive relevant information from a designer. By using the input-output device 50, the designer may receive information on regions or data paths of a semiconductor device, which are needed to have adjusted operating characteristics. The input-output device 50 may also be used to display a status or result of a process executed by the OPC tool 36.

The auxiliary memory device 70 may be provided as a storage medium of the computer system. The auxiliary memory device 70 may be used to store the application programs, the image of the operating system, and various kinds of data. The auxiliary memory device 70 may be or include one of memory cards (e.g., MMC, eMMC, SD, MicroSD, and so forth), a hard disk drive (HDD), or a solid state drive (SSD). The auxiliary memory device 70 may include a NAND FLASH memory device with a large memory capacity. In an embodiment, the auxiliary memory device 70 may include next-generation non-volatile memory devices (e.g., PRAM, MRAM, ReRAM, and FRAM devices) or a NOR FLASH memory device.

A system interconnector 90 may be further provided as a system bus for an internal network of the computer system. The CPU 10, the working memory 30, the input-output device 50, and the auxiliary memory device 70 may be electrically connected to each other through the system interconnector 90 to exchange data between them. However, the structure of the system interconnector 90 may not be limited to this example, and in an embodiment, an additional data-exchanging element may be further provided to improve the efficiency in a data processing process.

Figure 2:
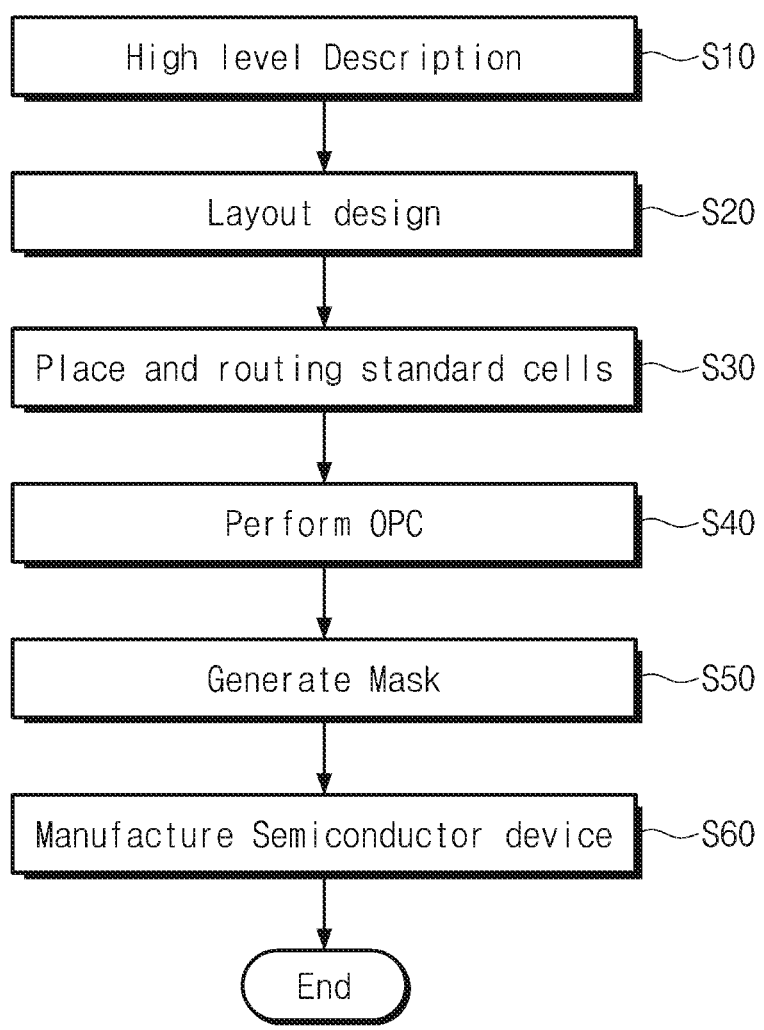
FIG. 2 is a flow chart illustrating a method of designing and fabricating a semiconductor device, according to an embodiment of the inventive concept.

FIG. 2 is a flow chart illustrating a method of designing and fabricating a semiconductor device, according to an embodiment of the inventive concept.

Referring to FIG. 2, a high-level design process of a semiconductor integrated circuit may be performed using the computer system described with reference to FIG. 1 (in S10). For example, in the high-level design process, an integrated circuit, which is a target object in a design process, may be described in terms of a high-level computer language. In an embodiment, the C language may be an example of the high-level computer language. Circuits designed by the high-level design process may be more concretely described by a register-transfer-level (RTL) coding or a simulation. Furthermore, codes generated by the RTL coding may be converted into a netlist, and the results may be combined to describe the entirety of the semiconductor device. The combined schematic circuit may be verified by a simulation tool, and in certain cases, an adjusting step may be further performed in consideration of a result of the verification step.

A layout design process may be performed to realize a logically-prepared form of the semiconductor integrated circuit on a silicon substrate (in S20). For example, the schematic circuit prepared in the high-level design process or the corresponding netlist may be referred during the layout design process.

A cell library, which is used for the layout design process, may contain information on operation, speed, and power consumption of a standard cell. Most of the layout design tools may be configured to define a cell library, which is used to represent a gate-level circuit in the form of a layout. Here, the layout may be prepared to define geometrical features (e.g., shapes, positions, or dimensions) of patterns, which are used to form transistors and metal interconnection lines to be actually integrated on a silicon substrate. For example, in order to actually form an inverter circuit on a silicon substrate, it may be necessary to properly place layouts for patterns (e.g., PMOS, NMOS, N-WELL, gate electrodes, and metal interconnection lines thereon). For this, a searching operation may be performed to choose the most suitable inverter layout from the inverter layouts which have been stored in the cell library.

A step of placing and routing various standard cells, which are stored in the cell library, may be performed (in S30). For example, the standard cells may be placed to form a two-dimensional arrangement. Then, high-level interconnection lines (routing patterns) may be placed on the placed standard cells. The routing step may be performed to connect the placed standard cells to each other in the previously-designed manner. The steps of placing and routing the standard cells may be automatically executed by the placement and routing tool 34 (FIG. 1).

After the routing step, a verification step may be performed on the layout to check whether there is a portion violating the given design rule. In an embodiment, the verification step may include evaluating verification items, such as a design rule check (DRC), an electrical rule check (ERC), and a layout vs schematic (LVS). Here, the DRC may be performed to evaluate whether the layout meets the given design rule, the ERC may be performed to evaluate whether there is an electrical disconnection issue in the layout, and the LVS may be performed to evaluate whether the layout is prepared to coincide with the gate-level netlist.

An OPC step may be performed (in S40). In general, optical proximity effects may occur when a photolithography process is performed on a silicon wafer using a photomask, which is manufactured based on the designed layout. The OPC step may be performed to correct the optical proximity or distortion issues in the photolithography process. For example, in the OPC step, the layout may be modified to reduce a difference in shape between designed patterns and actually-formed patterns, which may be caused by the optical proximity effects or during an exposure step of the photolithography process. As a result of the OPC step, the designed shapes and positions of the layout patterns may be slightly changed or biased.

A photomask may be generated, based on the layout modified by the OPC step (in S50). In general, the photomask may be manufactured or generated by patterning a chromium layer, which is formed on a glass substrate, in such a way to depict the layout pattern.

The generated photomask may be used to manufacture a semiconductor device (in S60). In the actual fabricating process, various exposing and etching steps may be performed or repeated to sequentially form patterns, which are defined in the layout design process, on a silicon substrate.

Figure 3:
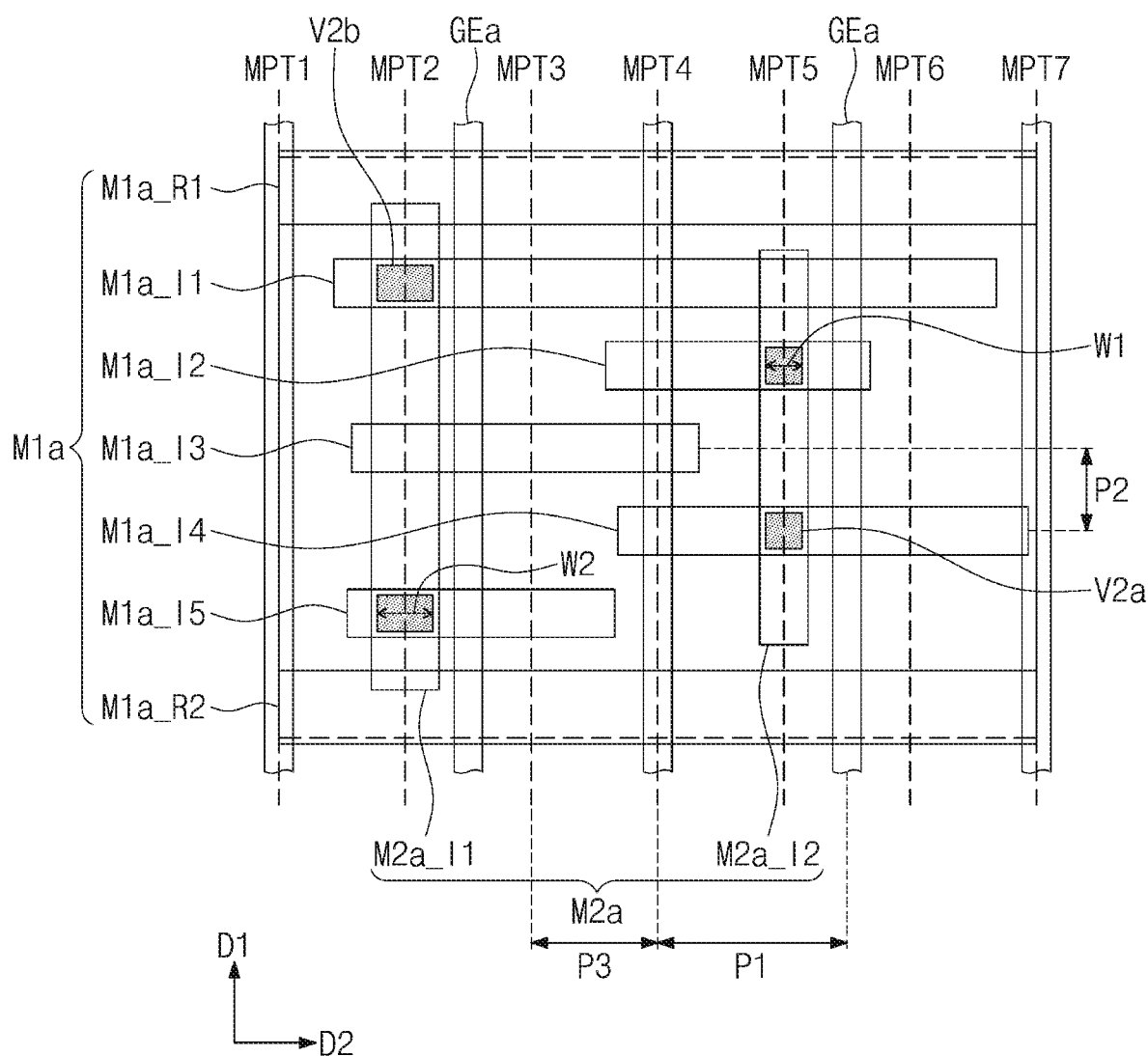
FIG. 3 is a layout of a standard cell designed through a step of designing a layout, shown in FIG. 2.

FIG. 3 is a layout of a standard cell designed through the step S20 of designing a layout, shown in FIG. 2. FIG. 3 illustrates an example of a standard cell STD for a single logic circuit. The designed structure of the standard cell STD will be described exemplarily with reference to FIG. 3.

The standard cell STD may include gate patterns GEa, first interconnection patterns M1a, second interconnection patterns M2a, and via patterns V2a and V2b. In addition, the standard cell STD may also include additional layout patterns (e.g., active regions, active contact patterns, and so forth). For convenience in illustration, the additional layout patterns (e.g., the active regions, the active contact patterns, and so forth) are omitted from the standard cell STD shown in FIG. 3.

The gate patterns GEa may be extended in a first direction D1 and may be arranged in a second direction D2, which is different from (e.g., perpendicular to) the first direction D1. The gate patterns GEa may be arranged with a first pitch P1. In the present specification, the term "pitch" may be a distance between a center line of a first pattern and a center line of a second pattern adjacent to the first pattern. The gate patterns GEa may define gate electrodes.

The first interconnection patterns M1a may be placed at a higher level than the gate patterns GEa. The first interconnection patterns M1a may define a first metal layer M1 (e.g., with first interconnection lines). In detail, the first interconnection patterns M1a may include a first lower power pattern M1a_R1, a second lower power pattern M1a_R2, and first to fifth lower interconnection patterns M1a_I1 to M1a_I5.

The first lower power pattern M1a_R1, the second lower power pattern M1a_R2, and the first to fifth lower interconnection patterns M1a_I1 to M1a_I5 may be patterns, which are provided on the same layer (or at the same level). The first lower power pattern M1a_R1, the second lower power pattern M1a_R2, and the first to fifth lower interconnection patterns M1a_I1 to M1a_I5 may be extended in the second direction D2 and parallel to each other.

The first lower power pattern M1a_R1 and the second lower power pattern M1a_R2 may be extended to cross the standard cell STD. The first to fifth lower interconnection patterns M1a_I1 to M1a_I5 may be arranged in the first direction D1, between the first lower power pattern M1a_R1 and the second lower power pattern M1a_R2. The first to fifth lower interconnection patterns M1a_I1 to M1a_I5 may be arranged with a second pitch P2. The second pitch P2 may be smaller than the first pitch P1.

A line width of each of the first and second lower power patterns M1a_R1 and M1a_R2 may be larger than a line width of each of the first to fifth lower interconnection patterns M1a_I1 to M1a_I5. Since the first and second lower power patterns M1a_R1 and M1a_R2 have a relatively large line width, the first and second lower power patterns M1a_R1 and M1a_R2 may have a relatively small interconnection resistance.

The second interconnection patterns M2a may be located at a higher level than the first interconnection patterns M1a. The second interconnection patterns M2a may define a second metal layer M2 (e.g., with second interconnection lines). In a layout of the standard cell STD, on which a routing has not yet been performed, the second interconnection patterns M2a may include first and second upper interconnection patterns M2a_I1 and M2a_I2. The first and second upper interconnection patterns M2a_I1 and M2a_I2 may be extended in the first direction D1 to be parallel to each other. The first and second upper interconnection patterns M2a_I1 and M2a_I2 may be parallel to the gate patterns GEa.

A line width of the first upper interconnection pattern M2a_I1 may be larger than a line width of the second upper interconnection pattern M2a_I2. Since the first upper interconnection pattern M2a_I1 has a relatively large line width, the first upper interconnection pattern M2a_I1 may have a relatively small interconnection resistance.

First to seventh interconnection tracks MPT1 to MPT7, which are imaginary lines used to dispose the second interconnection patterns M2a, may be defined in the standard cell STD. The first to seventh interconnection tracks MPT1 to MPT7 may be extended in the first direction D1. For example, the first upper interconnection pattern M2a_I1 may be placed on the second interconnection track MPT2. The first upper interconnection pattern M2a_I1 may be placed in such a way that its center is aligned to the second interconnection track MPT2. The second upper interconnection pattern M2a_I2 may be placed on the fifth interconnection track MPT5. The second upper interconnection pattern M2a_I2 may be placed in such a way that its center is aligned to the fifth interconnection track MPT5.

The first to seventh interconnection tracks MPT1 to MPT7 may be arranged with a third pitch P3 and in the second direction D2. The third pitch P3 may be smaller than the first pitch P1. The third pitch P3 may be larger than the second pitch P2.

At least one of the first to seventh interconnection tracks MPT1 to MPT7 may be aligned to a center of the gate pattern GEa. For example, the center of the gate pattern GEa may be aligned to the fourth interconnection track MPT4.

The via patterns V2a and V2b may be respectively placed in regions where the first interconnection pattern M1a and the second interconnection pattern M2a are overlapped with each other. The via patterns V2a and V2b may include a first via pattern V2a and a second via pattern V2b. In detail, the first via pattern V2a may be placed between the second lower interconnection pattern M1a_I2 and the second upper interconnection pattern M2a_I2. The second via pattern V2b may be placed between the first lower interconnection pattern M1a_I1 and the first upper interconnection pattern M2a_I1.

The first via pattern V2a may have a first width W1 in the second direction D2. The second via pattern V2b may have a second width W2 in the second direction D2. The second width W2 may be larger than the first width W1.

As described above, the line width of the first upper interconnection pattern M2a_I1 may be larger than the line width of the second upper interconnection pattern M2a_I2. Owing to the line width of the first upper interconnection pattern M2a_I1, the second via pattern V2b may have a relatively large width W2. Owing to the line width of the second upper interconnection pattern M2a_I2, the first via pattern V2a may have a relatively small width W1.

The via patterns V2a and V2b may define via plugs, which are used to vertically connect the first interconnection line (e.g., the first interconnection pattern M1a) with the second interconnection line (e.g., the second interconnection pattern M2a). As an example, the via patterns V2a and V2b, along with the second interconnection patterns M2a, may define the second metal layer.

Figure 4:
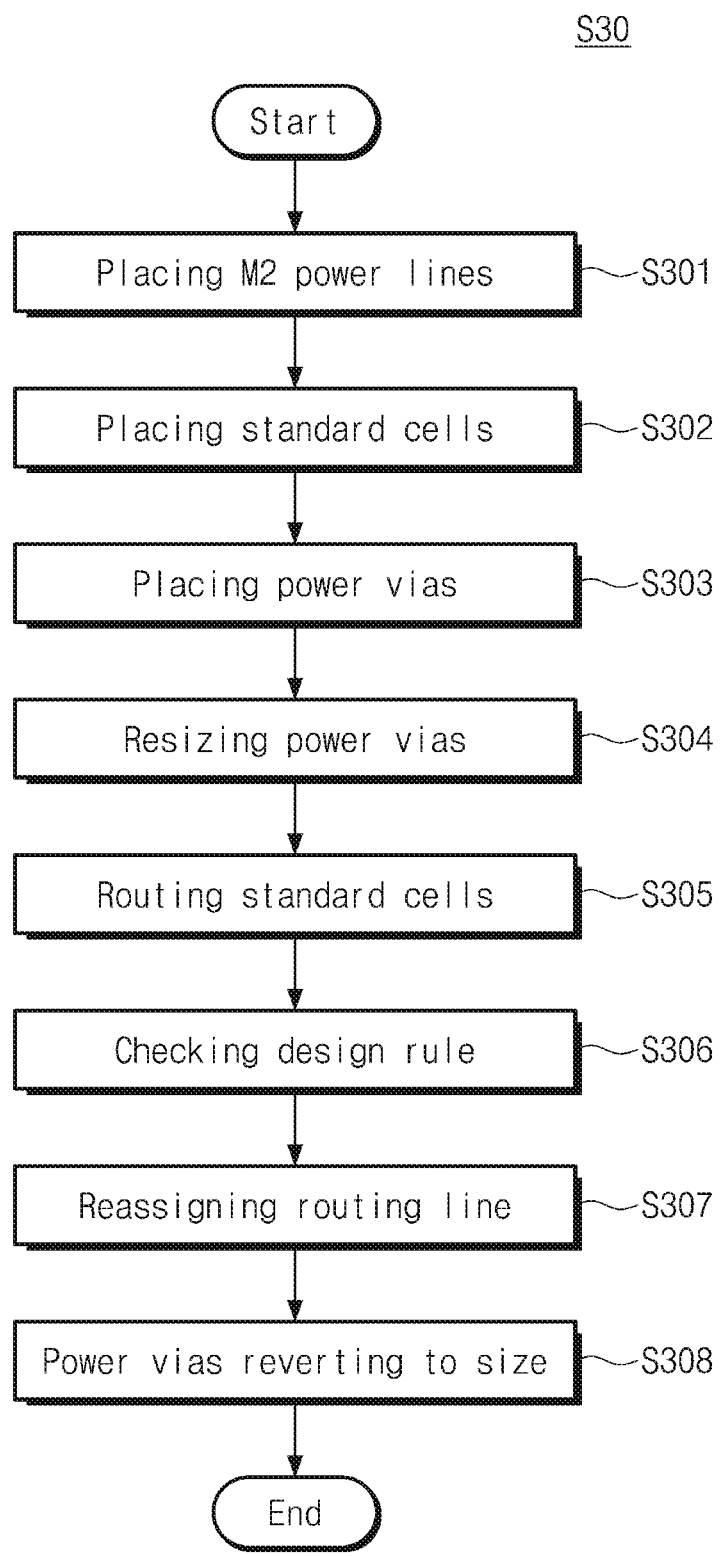
FIG. 4 is a flow chart concretely illustrating a step of placing and routing standard cells, shown in FIG. 2.

FIG. 4 is a flow chart concretely illustrating the step S30 of placing and routing standard cells, shown in FIG. 2. FIGS. 5 to 11 are layout diagrams illustrating the step of placing and routing standard cells, shown in FIG. 4.

Figure 5:
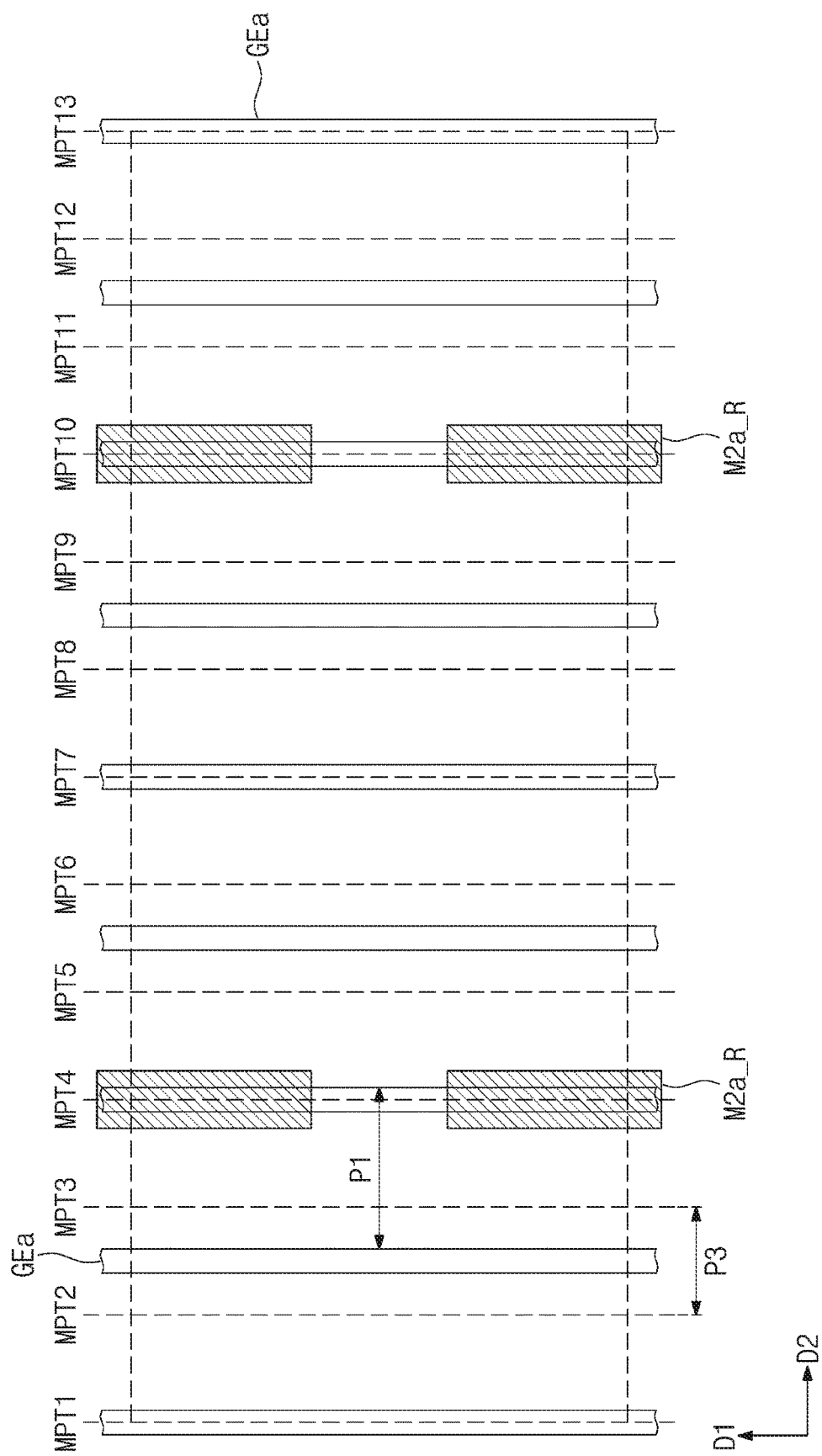
FIGS. 5 to 11 are layout diagrams illustrating the step of placing and routing standard cells, shown in FIG. 4.

Referring to FIGS. 4 and 5, the gate patterns GEa extending in the first direction D1 may be placed in the second direction D2. The gate patterns GEa may be arranged with the first pitch P1.

First to thirteenth interconnection tracks MPT1 to MPT13 may be defined. The first to thirteenth interconnection tracks MPT1 to MPT13 may be extended in the first direction D1 to be parallel to each other. The first to thirteenth interconnection tracks MPT1 to MPT13 may be arranged with the third pitch P3 and in the second direction D2.

Some of the first to thirteenth interconnection tracks MPT1 to MPT13 may be overlapped with the gate patterns GEa. For example, each of the first, fourth, seventh, tenth, and thirteenth interconnection tracks MPT1, MPT4, MPT7, MPT10, and MPT13 may cross the center of a corresponding one of the gate patterns GEa.

Power lines of the second metal layer M2 may be placed (in S301). In detail, a pair of upper power patterns M2a_R may be placed on at least one of the first to thirteenth interconnection tracks MPT1 to MPT13. For example, the pair of the upper power patterns M2a_R may be placed on the fourth interconnection track MPT4. The pair of the upper power patterns M2a_R may be placed on the tenth interconnection track MPT10. The upper power patterns M2a_R may define the power lines of the second metal layer M2.

Each of the pair of the upper power patterns M2a_R may have a bar shape extending in the first direction D1. The pair of the upper power patterns M2a_R may be overlapped with the gate pattern GEa. In other words, the pair of the upper power patterns M2a_R may be provided on the gate pattern GEa. The pair of the upper power patterns M2a_R may be arranged along the gate pattern GEa and in the first direction D1. The pair of the upper power patterns M2a_R may be arranged along the gate pattern GEa and in the first direction D1.

Each of the upper power patterns M2a_R may have a relatively large line width. For example, a line width of each of the upper power patterns M2a_R may be substantially equal to a line width of the first upper interconnection pattern M2a_I1. Alternatively, although not shown, a line width of each of the upper power patterns M2a_R may be larger than a line width of the first upper interconnection pattern M2a_I1.

Figure 6:
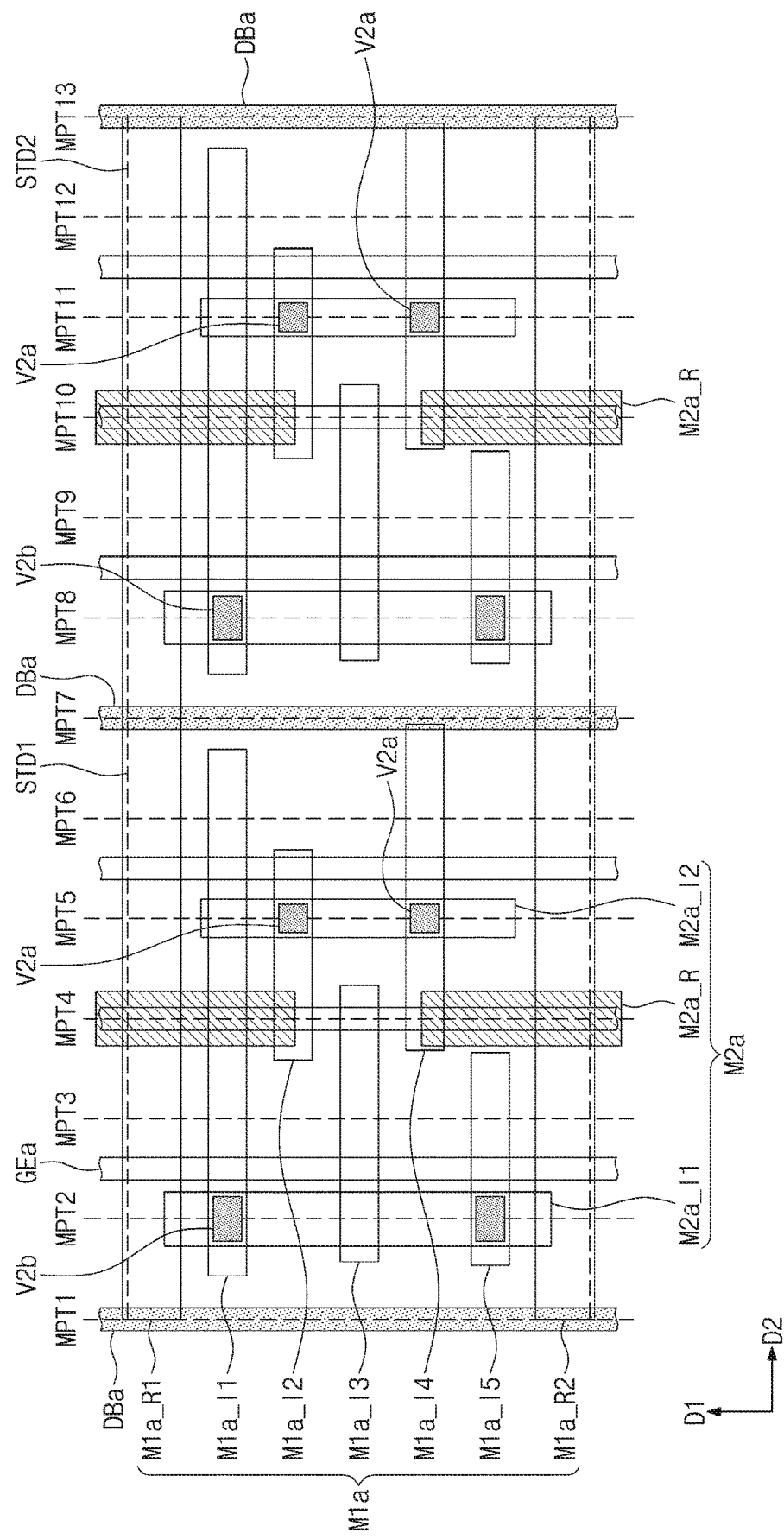

Referring to FIGS. 4 and 6, standard cells may be placed (in S302). In detail, first and second standard cells STD1 and STD2 may be placed in the second direction D2. For example, each of the first and second standard cells STD1 and STD2 may be the standard cell STD previously described with reference to FIG. 3.

A pair of separation patterns DBa may be placed at both sides of each of the first and second standard cells STD1 and STD2. For example, the gate patterns GEa at both sides of the first standard cell STD1 may be replaced with the separation patterns DBa. The gate patterns GEa at both sides of the second standard cell STD2 may be replaced with the separation patterns DBa. The separation pattern DBa may be interposed between the first and second standard cells STD1 and STD2.

In each of the first and second standard cells STD1 and STD2, the previously-placed upper power pattern M2a_R may be located between the first and second upper interconnection patterns M2a_I1 and M2a_I2.

Figure 7:
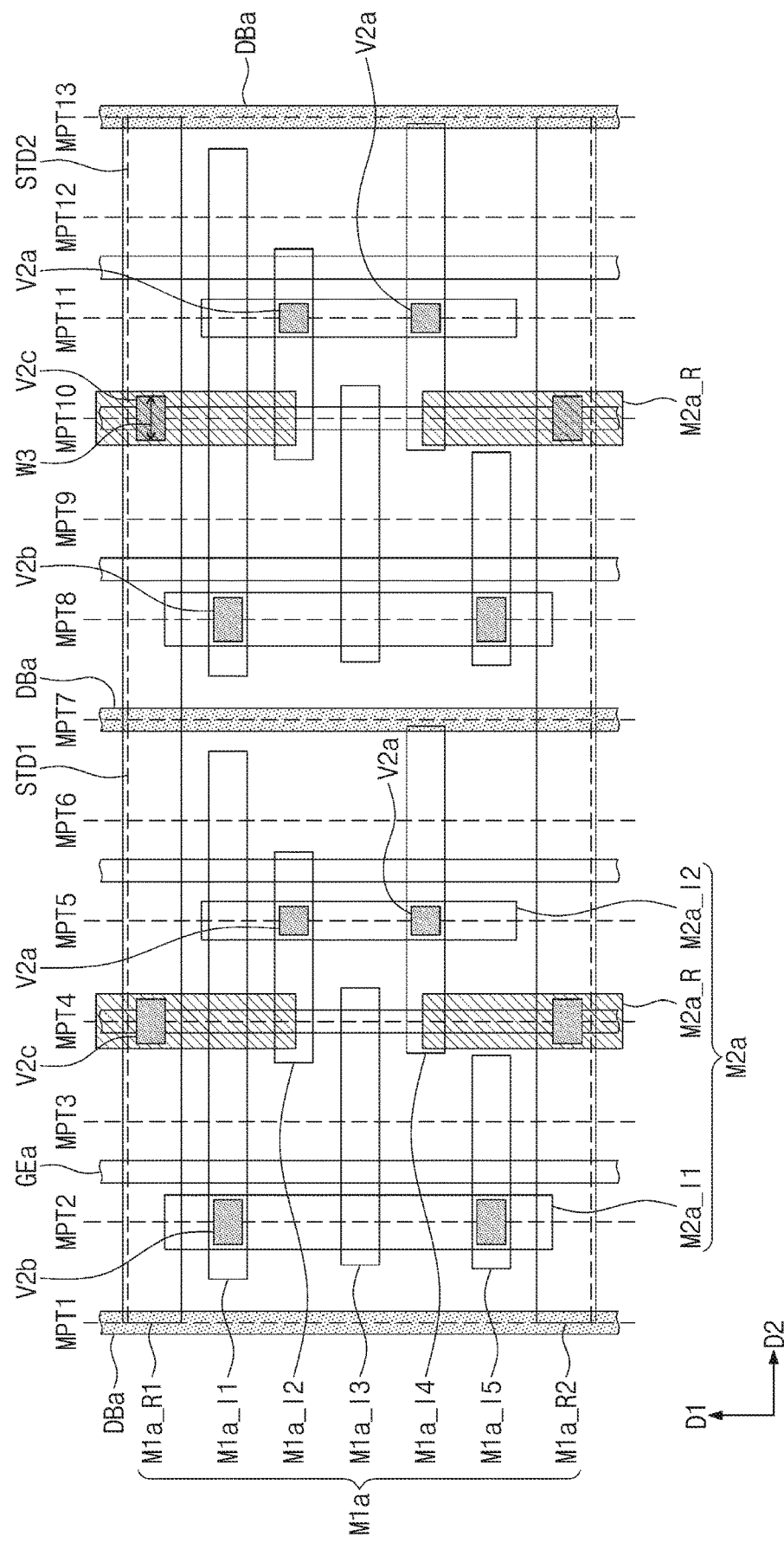

Referring to FIGS. 4 and 7, power vias may be placed (in S303). In detail, a third via pattern V2c may be placed in a region where the first lower power pattern M1a_R1 and the upper power pattern M2a_R are overlapped with each other. The third via pattern V2c may be placed in a region where the second lower power pattern M1a_R2 and the upper power pattern M2a_R are overlapped with each other. The third via pattern V2c may define connection between the upper power pattern M2a_R and the lower power pattern M1a_R1 or M1a_R2.

The third via pattern V2c may have substantially the same shape as the second via pattern V2b. For example, the third via pattern V2c may have a third width W3 in the second direction D2. The third width W3 may be substantially equal to the second width W2 of the second via pattern V2b previously described with reference to FIG. 3.

Figure 8:
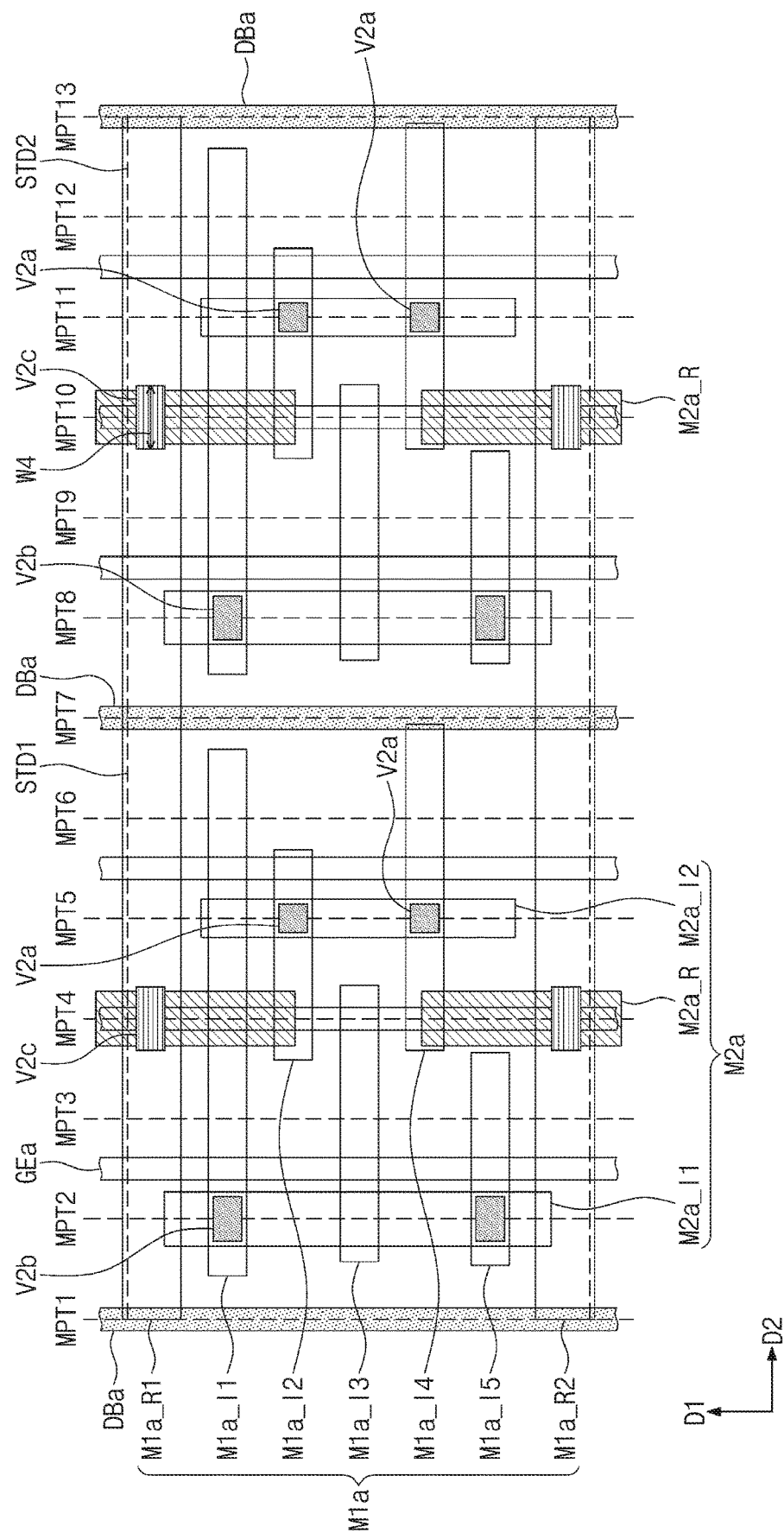

Referring to FIGS. 4 and 8, power vias may be resized (in S304). In detail, a size of each of the third via patterns V2c may be adjusted or resized. For example, a width of each of the third via patterns V2c may be increased from the third width W3 to a fourth width W4. Thus, a shape of the third via pattern V2c may become different from a shape of the second via pattern V2b. In other words, since the third via pattern V2c is resized, the placement and routing tool 34 of FIG. 1 may recognize the second and third via patterns V2b and V2c as different vias. The placement and routing tool 34 may apply different design rules to the second and third via patterns V2b and V2c.

Figure 9:
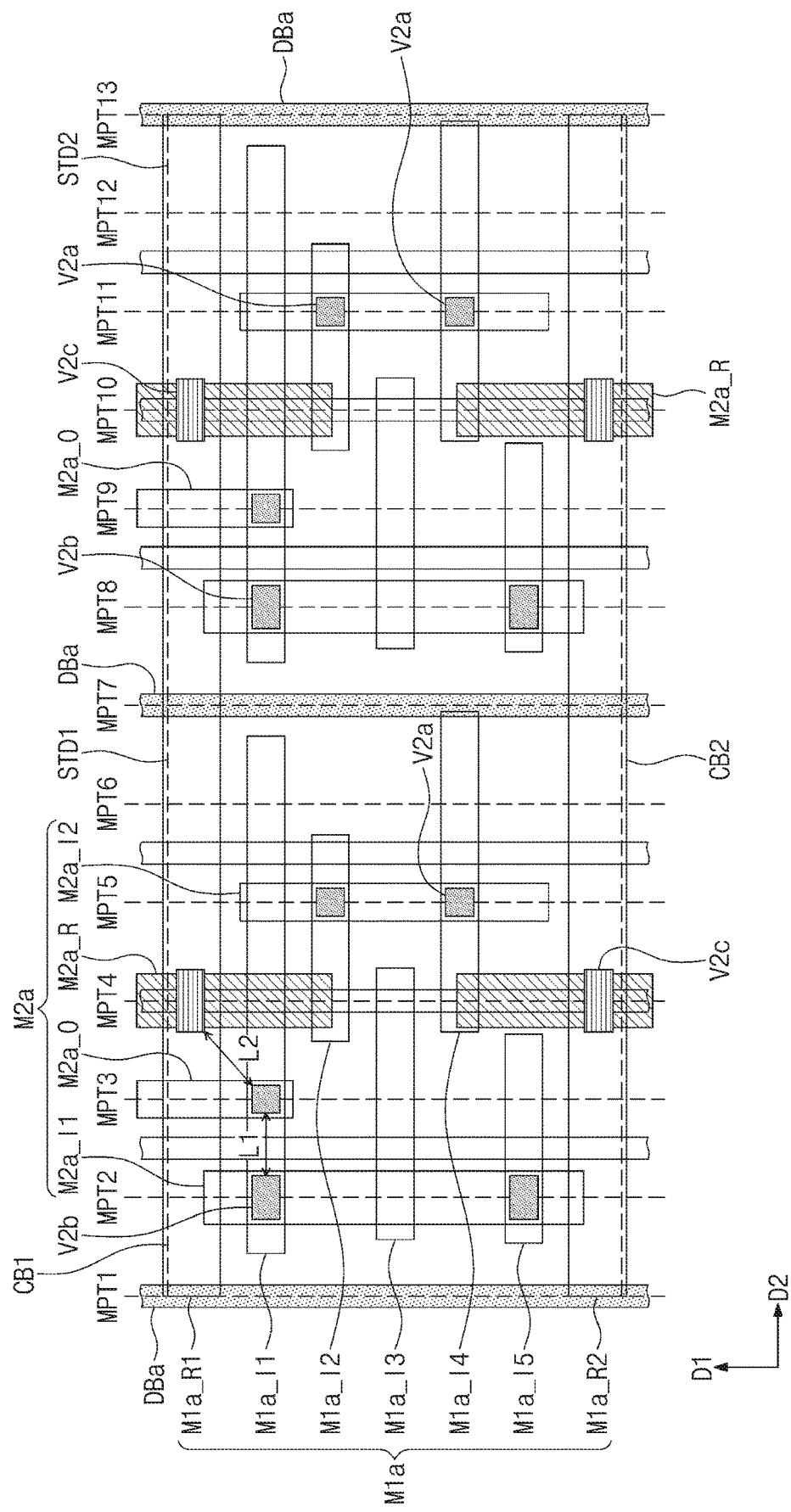

Referring to FIGS. 4 and 9, a routing step may be performed on the standard cells (in S305). In detail, the routing of the first and second standard cells STD1 and STD2 may include placing routing patterns M2a_O. As a result of the placing of the routing patterns M2a_O, the standard cells may be connected to each other in accordance with a designed structure of the circuit.

A first cell boundary CB1 [CB1 is not labeled in FIG. 9] extending in the second direction D2 may be defined in each of the first and second standard cells STD1 and STD2. In each of the first and second standard cells STD1 and STD2, a second cell boundary CB2 may be defined at a region opposite to the first cell boundary CB1. The first lower power pattern M1a_R1 may be placed on the first cell boundary CB1. The second lower power pattern M1a_R2 may be placed on the second cell boundary CB2.

The routing patterns M2a_O may be placed on the third interconnection track MPT3 and the ninth interconnection track MPT9, respectively. The routing patterns M2a_O may be extended from the standard cell to a region outside the first cell boundary CB1 or the second cell boundary CB2. As an example, the routing pattern M2a_O may be connected to the first lower interconnection pattern M1a_I1. The routing patterns M2a_O, the first and second upper interconnection patterns M2a_I1 and M2a_I2, and the upper power patterns M2a_R may constitute the second interconnection patterns M2a. The second interconnection patterns M2a may define the second metal layer M2 (e.g., with the second interconnection lines).

The first via pattern V2a may be placed between the routing pattern M2a_O and the first lower interconnection pattern M1a_I1. The first via pattern V2a may define connection between the routing pattern M2a_O and the first lower interconnection pattern M1a_I1.

If the placement of the routing patterns M2a_O and the first via patterns V2a is finished, a design rule may be checked (in S306). In detail, a distance between the first via pattern V2a and the second via pattern V2b, which are placed adjacent to each other by the routing step, may be measured to check whether it satisfies the design rule. Similarly, a distance between the first and third via patterns V2a and V2c, which are placed adjacent to each other by the routing step, may be measured to check whether it satisfies the design rule.

It may be evaluated that a first distance L1, which is the distance between the first via pattern V2a and the second via pattern V2b, satisfies the design rule. Meanwhile, since the third via pattern V2c connecting an underlying power line to another power line thereon should have a relatively small resistance, a relatively tight design rule may be required for the third via pattern V2c. In certain cases, a second distance L2, which is the distance between the first and third via patterns V2a and V2c, may be larger than the first distance L1. However, it may be evaluated that this value does not satisfy a design rule required for the third via pattern V2c.

Figure 10:
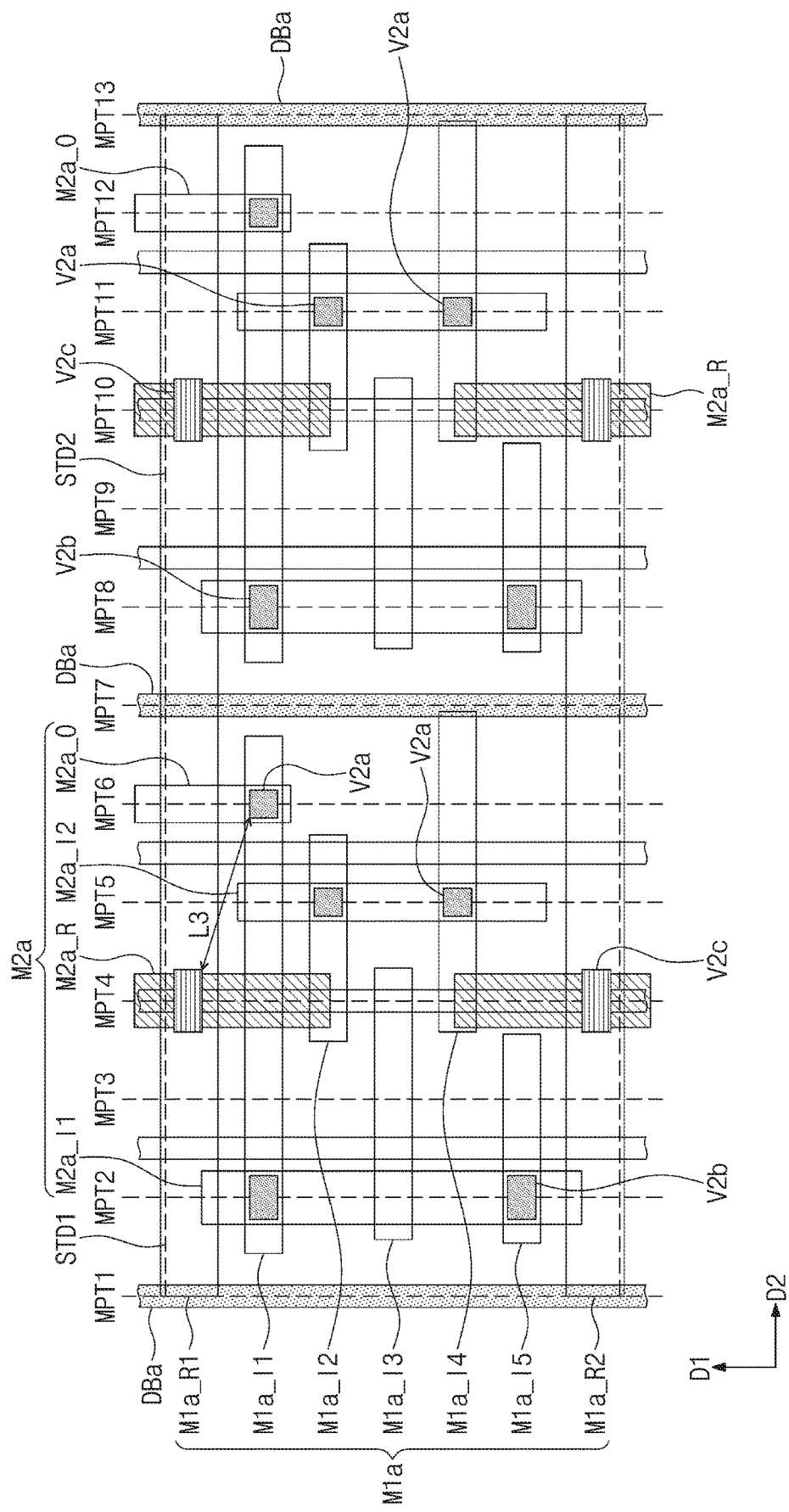

Referring to FIGS. 4 and 10, a routing line violating the design rule may be reassigned (in S307). In detail, the routing pattern M2a_O may be reassigned from the third interconnection track MPT3 to the sixth interconnection track MPT6. The routing pattern M2a_O may be reassigned from the ninth interconnection track MPT9 to the twelfth interconnection track MPT12.

The first via pattern V2a may be placed between the routing pattern M2a_O and the first lower interconnection pattern M1a_I1. A distance between the first and third via patterns V2a and V2c adjacent to each other may be measured to be a third distance L3. The third distance L3 may be larger than the second distance L2. It may be evaluated that the third distance L3 satisfies the design rule required for the third via pattern V2c.

Figure 11:
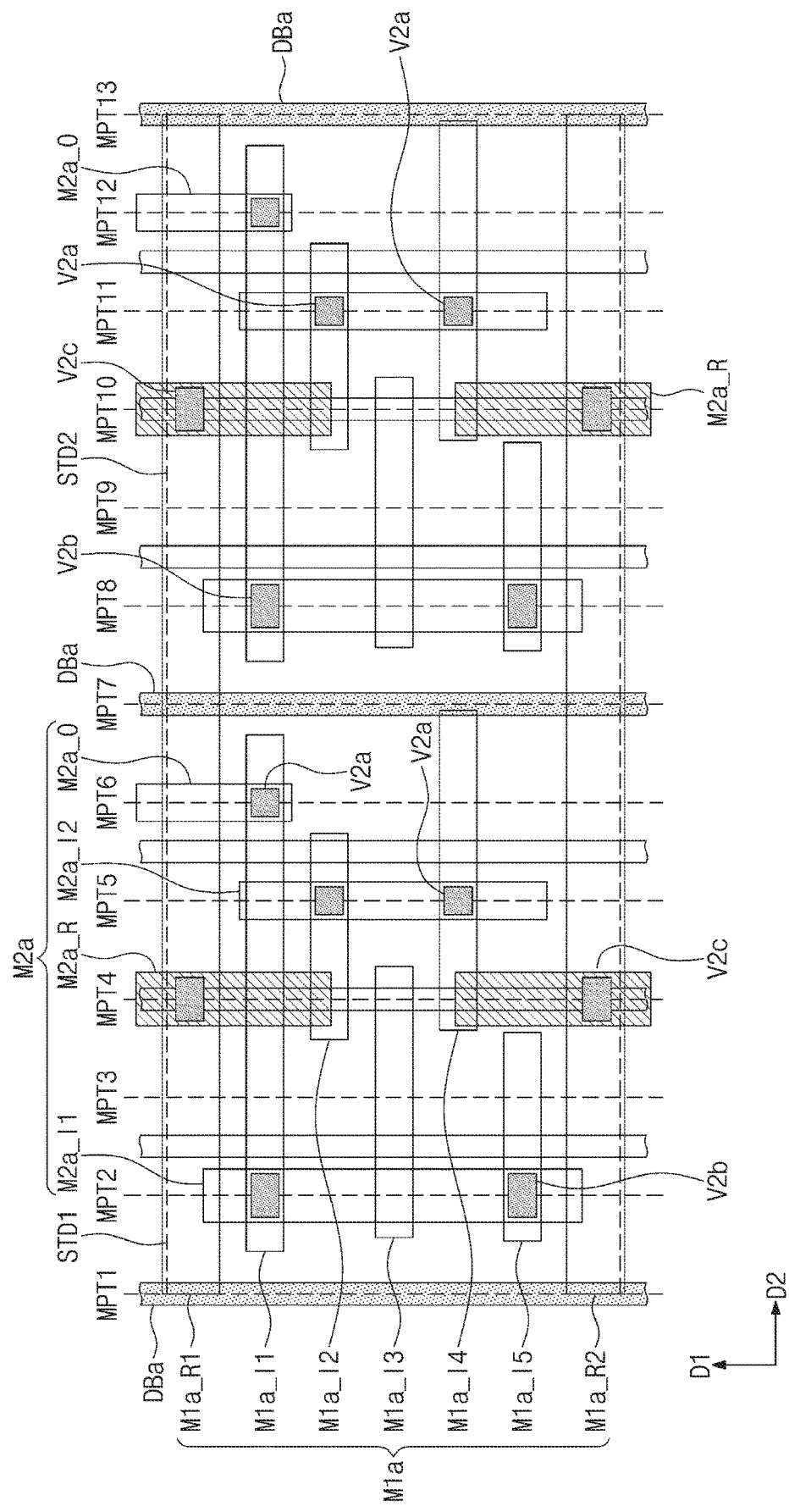

Referring to FIGS. 4 and 11, the size of the power vias may be restored (in S308). In detail, if the result of the routing step satisfies the design rule required for the third via pattern V2c, the size of the third via pattern V2c may be restored to its original size. That is, the size and shape of the third via pattern V2c may become the same as the size and shape of the second via pattern V2b.

If the placement and routing of the standard cells described with reference to FIG. 4 and FIGS. 5 to 11 is finished, an optical proximity correction may be performed on a designed layout and a photomask may be manufactured or generated. A semiconductor fabrication process using the generated photomask may be performed to fabricate a semiconductor device (e.g., see FIG. 1).

Figure 12:
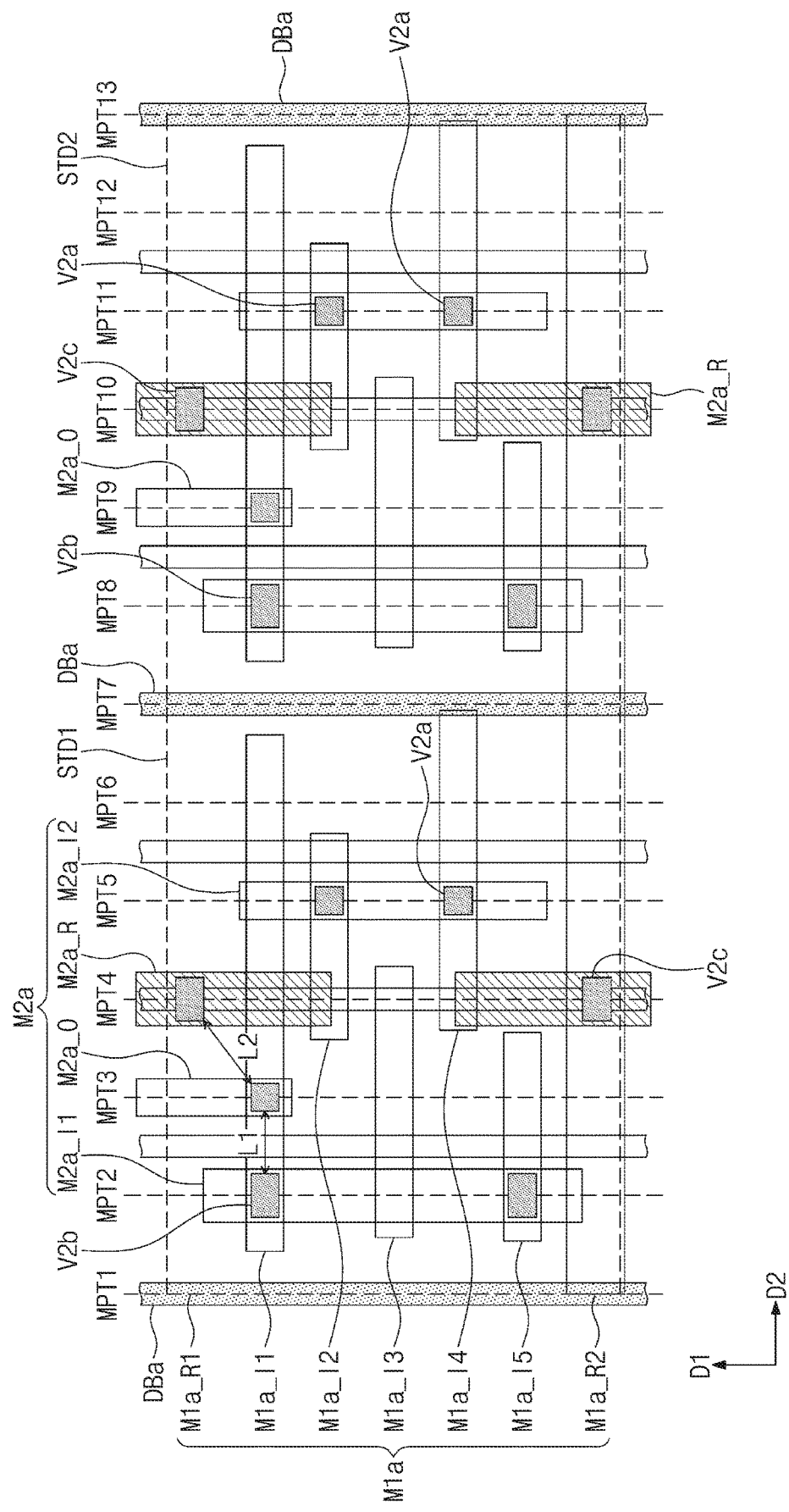
FIG. 12 is a layout diagram illustrating a step of placing and routing standard cells, according to a comparative example of the inventive concept.

FIG. 12 is a layout diagram illustrating a step of placing and routing standard cells, according to a comparative example of the inventive concept. In detail, the step S304 of resizing power vias previously described with reference to FIGS. 4 and 8 may be omitted from the method according to this comparative example.

Referring to FIGS. 4 and 12, since the step S304 of resizing the power vias is omitted, the size and shape of the third via pattern V2c may be maintained to be the same as those of the second via pattern V2b. Thus, the placement and routing tool 34 cannot recognize the second and third via patterns V2b and V2c as different vias. Thus, different design rules cannot be applied to the second and third via patterns V2b and V2c.

As previously described with reference to FIG. 9, the routing step (in S305) may be performed to place the routing patterns M2a_O on the third interconnection track MPT3 and the ninth interconnection track MPT9, respectively. The first via pattern V2a may be placed.

The design rule may be checked (in S306). Here, a distance between the first and third via patterns V2a and V2c may be the second distance L2, and thus, the placement and routing tool 34 may determine that a design rule on geometrical features (e.g., distance) between the first and third via patterns V2a and V2c is satisfied. This is because, as described above, the placement and routing tool 34 applies the same design rule as that for the second via pattern V2b to the third via pattern V2c.

As a result, according to the comparative example, the placement and routing tool 34 may determine that there is no violation of the design rule and may finish the routing step. The result according to the layout of FIG. 11 may differ from that according to the layout of FIG. 12. Since, as illustrated in FIG. 11, the distance L2 between the first and third via patterns V2a and V2c is relatively small, the first via pattern V2a may lead to a process failure, when the power via is formed in a subsequent process, or deterioration in performance of the semiconductor device.

According to an embodiment of the inventive concept, the step of resizing the power vias is performed to cause a difference between the second and third via patterns V2b and V2c, before the routing step, and this may allow the placement and routing tool 34 to apply different design rules to the second and third via patterns V2b and V2c, respectively. Thus, it may be possible to satisfy a design rule required for the third via pattern V2c, which is used as the power via, and thereby to prevent a process failure from occurring in a subsequent fabrication process or the performance of the semiconductor device from being deteriorated.

According to an embodiment of the inventive concept, a power via having a relatively large size may be provided to reduce a connection resistance between a lower power line and an upper power line. This may make it possible to improve electric characteristics of a semiconductor device.

Figure 13:
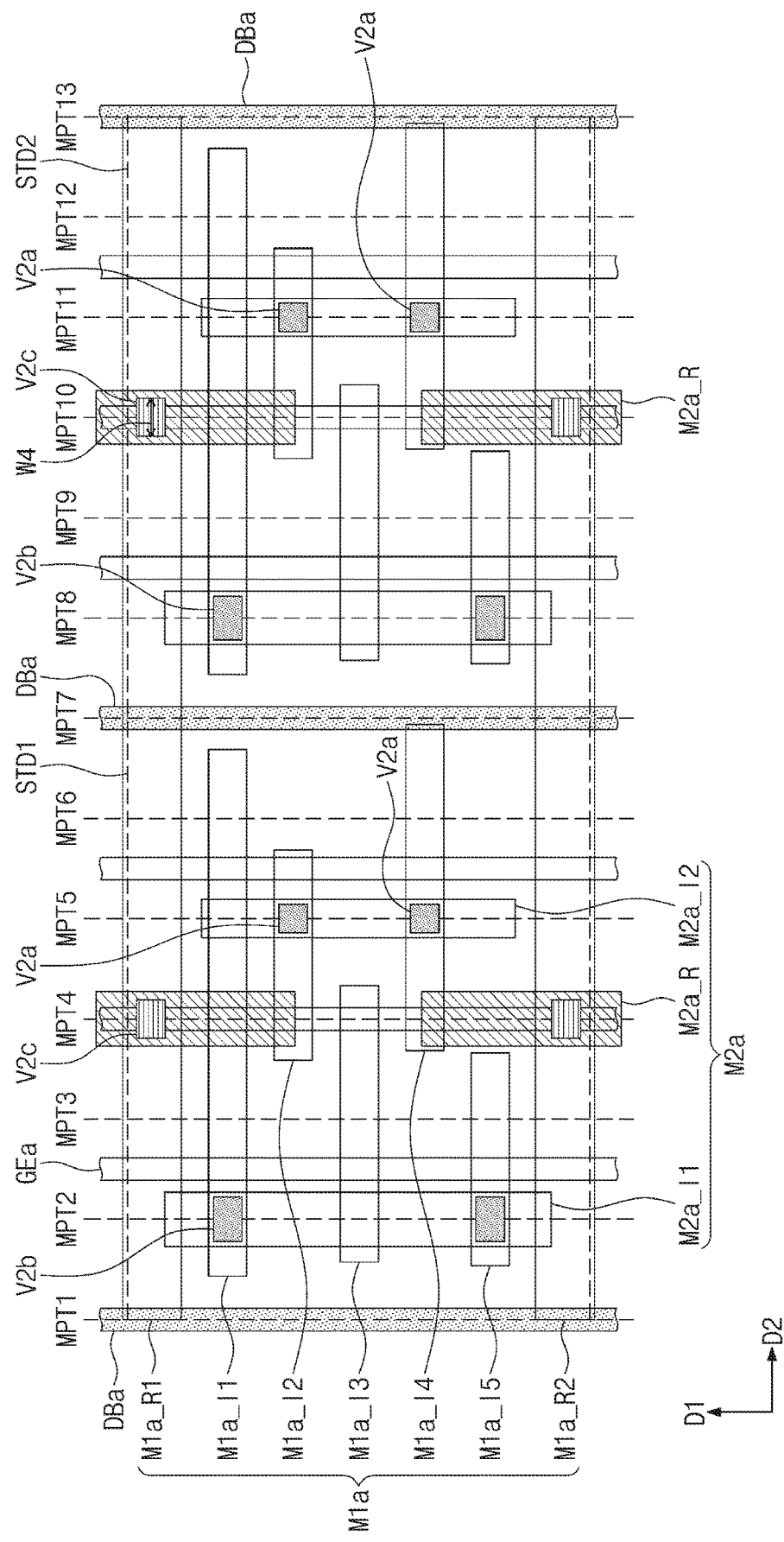
FIG. 13 is a layout diagram according to another embodiment of the inventive concept.

FIG. 13 is a layout diagram according to another embodiment of the inventive concept. Referring to FIGS. 4 and 13, the step S304 of resizing the power via may include reducing the width of the third via pattern V2c. For example, a width of each of the third via patterns V2c may be reduced from the third width W3 to the fourth width W4. In this case, the third via pattern V2c has a different shape from the second via pattern V2b and the placement and routing tool 34 of FIG. 1 may recognize the second via pattern V2b and the third via pattern V2c as different vias.

However, the width W4 of the third via pattern V2c may be larger than the first width W1 of the first via pattern V2a of FIG. 3. In the case where the width W4 of the third via pattern V2c has the same value as the first width W1, the placement and routing tool 34 cannot recognize the first and third via patterns V2a and V2c as different vias.

Figure 14:
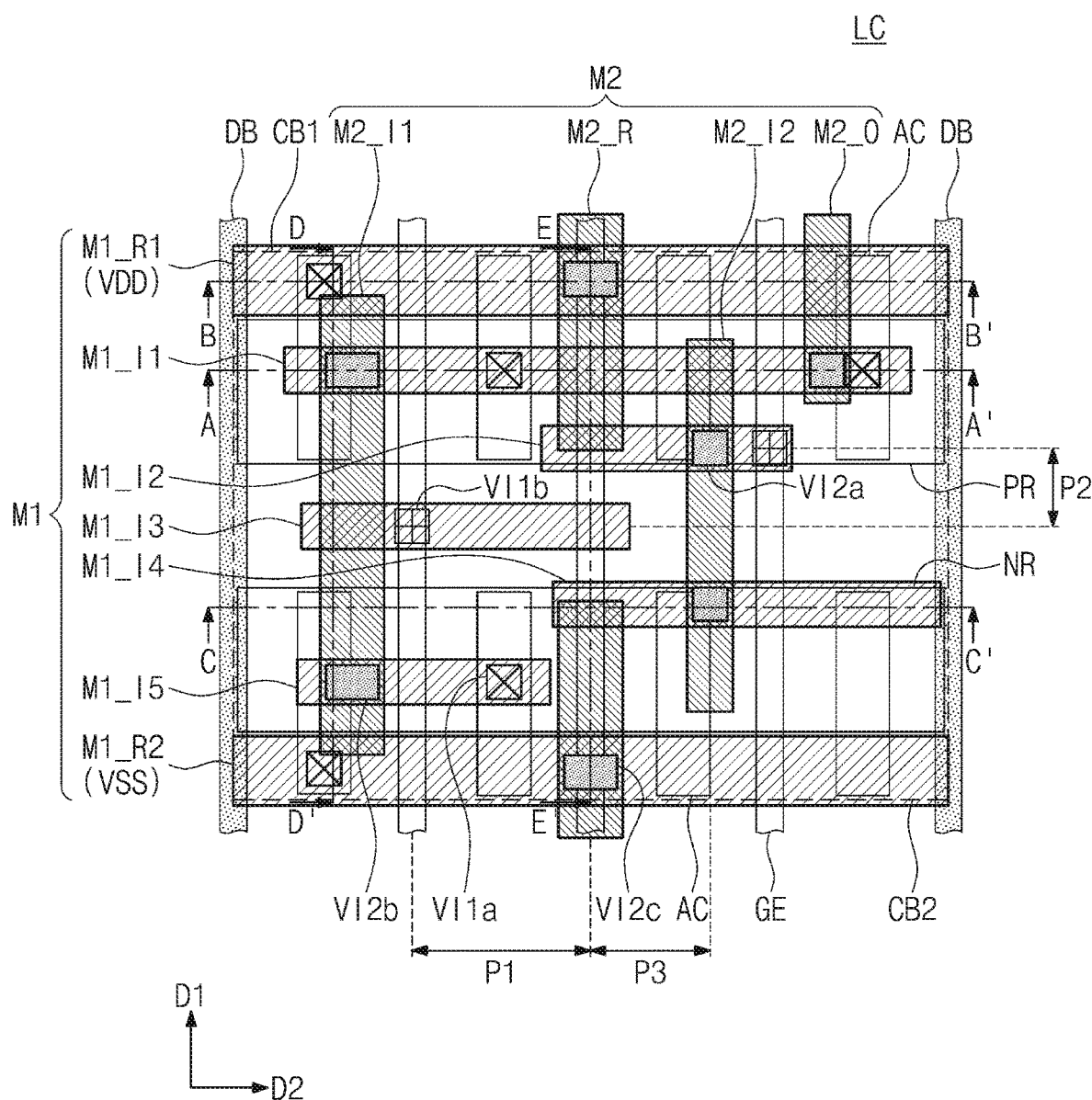
FIG. 14 is a plan view illustrating a semiconductor device according to an embodiment of the inventive concept.

FIG. 14 is a plan view illustrating a semiconductor device according to an embodiment of the inventive concept. FIGS. 15A to 15E are sectional views, which are respectively taken along lines A-A', B-B', C-C', D-D', and E-E' of FIG. 14. The semiconductor device shown in FIG. 14 and FIGS. 15A to 15E may be an example of a semiconductor device, which is realized on a substrate using the layout of the first standard cell STD1 of FIG. 11.

Referring to FIGS. 14 and 15A to 15E, a logic cell LC may be provided on a substrate 100. Logic transistors constituting a logic circuit may be placed on the logic cell LC.

The substrate 100 may include a first active region PR and a second active region NR. In an embodiment, the first active region PR may be a PMOSFET region, and the second active region NR may be an NMOSFET region. The substrate 100 may be a semiconductor substrate (e.g., including silicon, germanium, or silicon-germanium) or a compound semiconductor substrate. As an example, the substrate 100 may be a silicon wafer.

The first and second active regions PR and NR may be defined by a second trench TR2 (FIG. 15D), which is formed in an upper portion of the substrate 100. The second trench TR2 may be positioned between the first and second active regions PR and NR. The first and second active regions PR and NR may be spaced apart from each other in the first direction D1, with the second trench TR2 interposed therebetween. Each of the first and second active regions PR and NR may be extended in the second direction D2 that is different from the first direction D1.

Figure 15A:
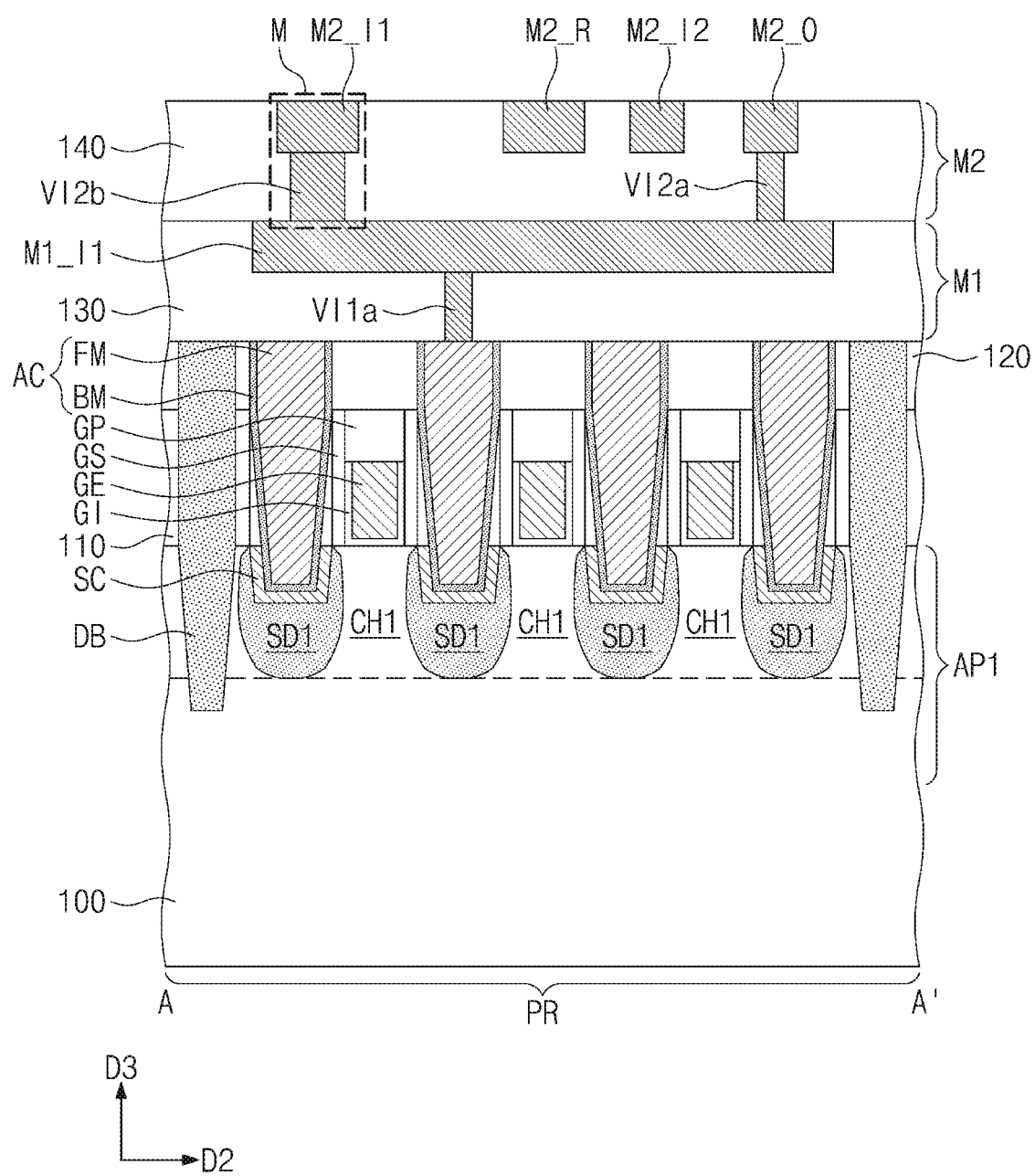
FIGS. 15A to 15E are sectional views, which are respectively taken along lines A-A', B-B', C-C', D-D', and E-E' of FIG. 14.
Figure 15B:
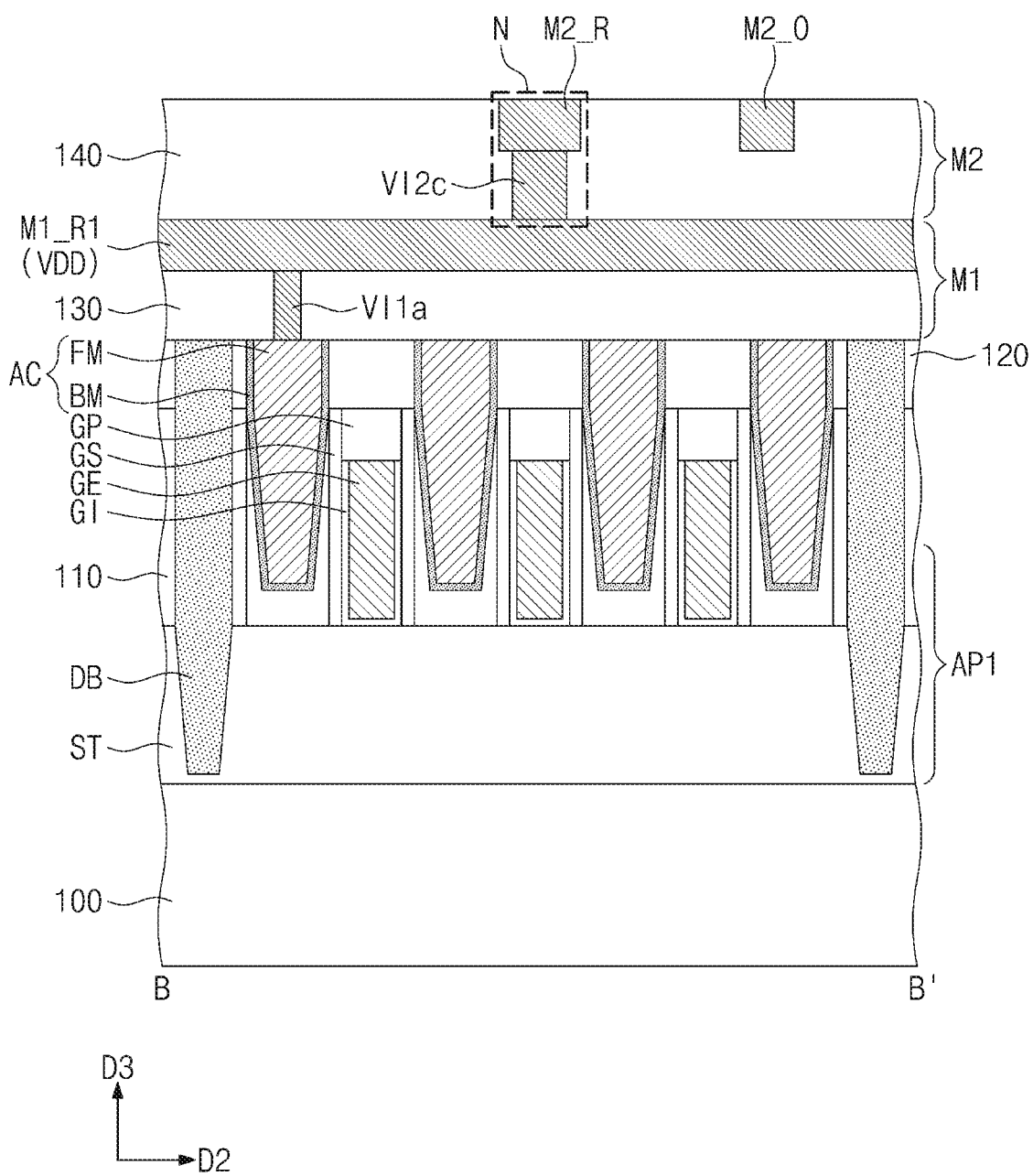
Figure 15C:
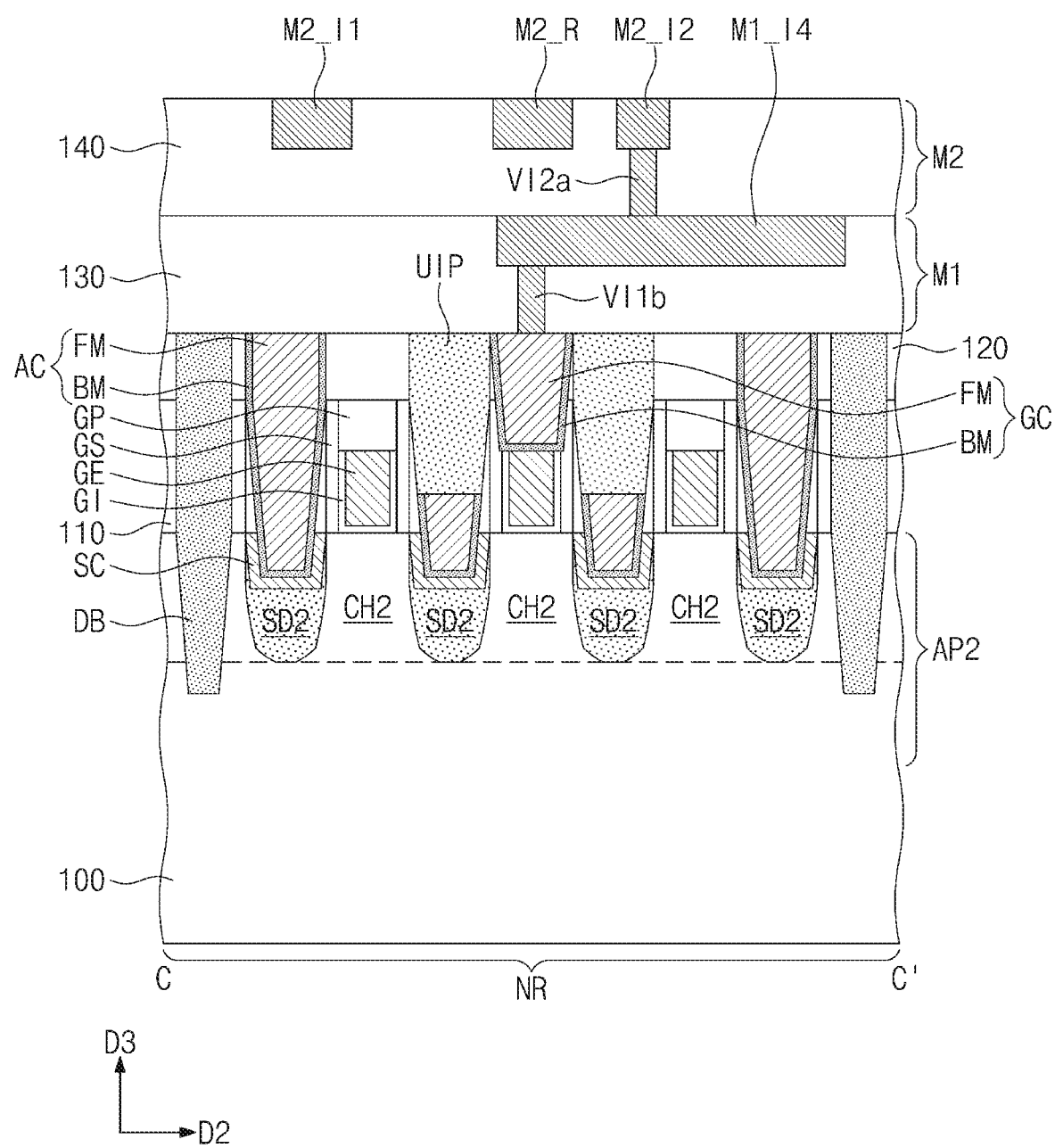
Figure 15D:
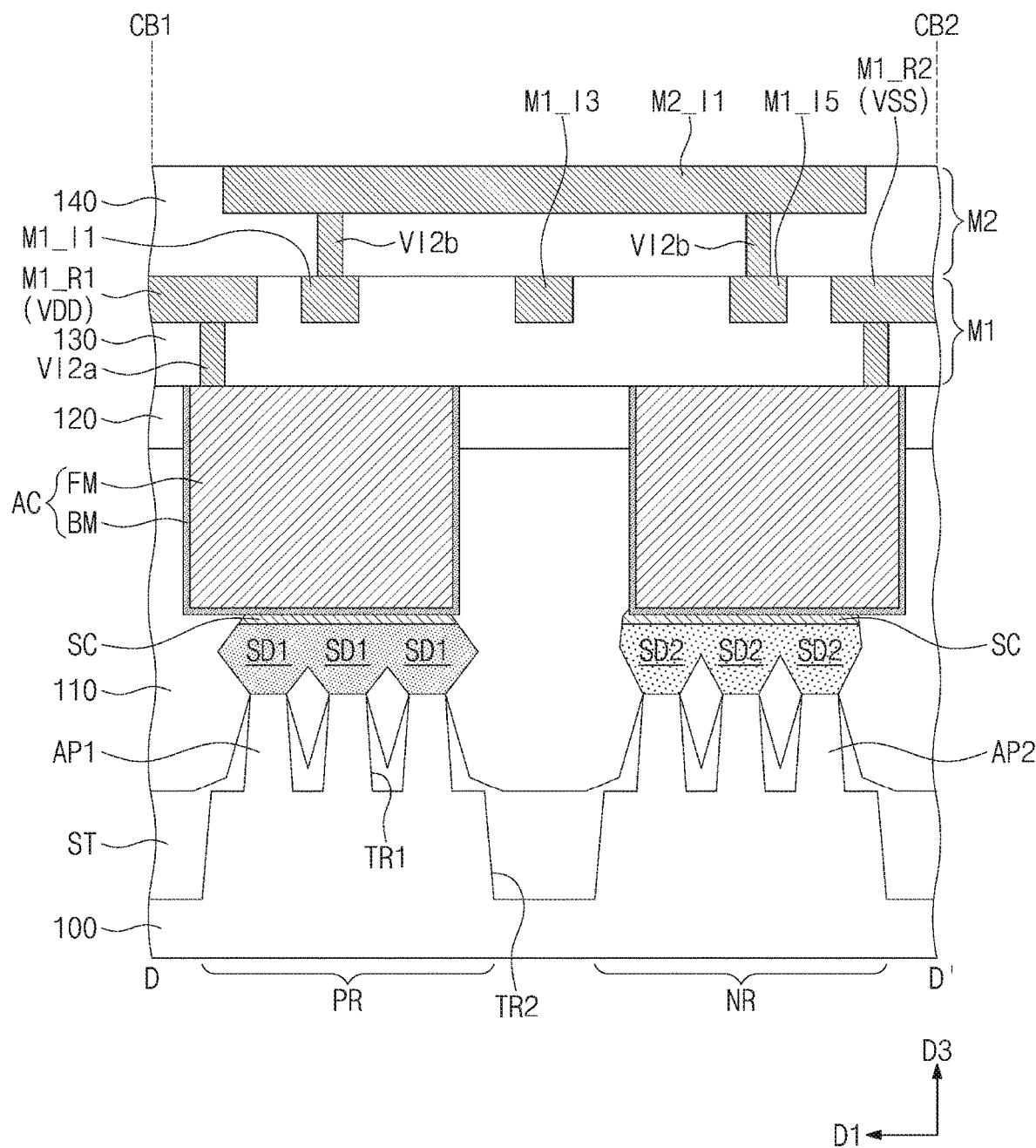

First active patterns AP1 and second active patterns AP2 may be provided on the first active region PR and the second active region NR, respectively, as shown in FIG. 15D. The first and second active patterns AP1 and AP2 may be extended in the second direction D2 to be parallel to each other. The first and second active patterns AP1 and AP2 may be portions of the substrate 100, which have a vertically protruding shape. A first trench TR1 (FIG. 15D) may be defined between adjacent ones of the first active patterns AP1 and between adjacent ones of the second active patterns AP2. The first trench TR1 may be shallower than the second trench TR2.

A device isolation layer ST (FIG. 15D) may fill the first and second trenches TR1 and TR2. The device isolation layer ST may be formed of or include silicon oxide. Upper portions of the first and second active patterns AP1 and AP2 may have a shape vertically protruding above the device isolation layer ST (e.g., see FIG. 15E). Each of the upper portions of the first and second active patterns AP1 and AP2 may be shaped like a fin. The device isolation layer ST may not cover the upper portions of the first and second active patterns AP1 and AP2. The device isolation layer ST may cover lower side surfaces of the first and second active patterns AP1 and AP2.

First source/drain patterns SD1 (FIG. 15A, FIG. 15D) may be provided on the upper portions of the first active patterns AP1. The first source/drain patterns SD1 may be impurity regions of a first conductivity type (e.g., p-type). A first channel pattern CH1 may be interposed between a pair of the first source/drain patterns SD1, as shown in FIG. 15A. Second source/drain patterns SD2 (FIG. 15C, FIG. 15D) may be provided on the upper portions of the second active patterns AP2. The second source/drain patterns SD2 may be impurity regions of a second conductivity type (e.g., n-type). A second channel pattern CH2 may be interposed between a pair of the second source/drain patterns SD2, as shown in FIG. 15C.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may be formed of or include a semiconductor material (e.g., SiGe) whose lattice constant is larger than that of the semiconductor material of the substrate 100. Accordingly, the first source/drain patterns SD1 may exert a compressive stress on the first channel patterns CH1. As an example, the second source/drain patterns SD2 may be formed of or include the same semiconductor material (e.g., Si) as the substrate 100.

Figure 15E:
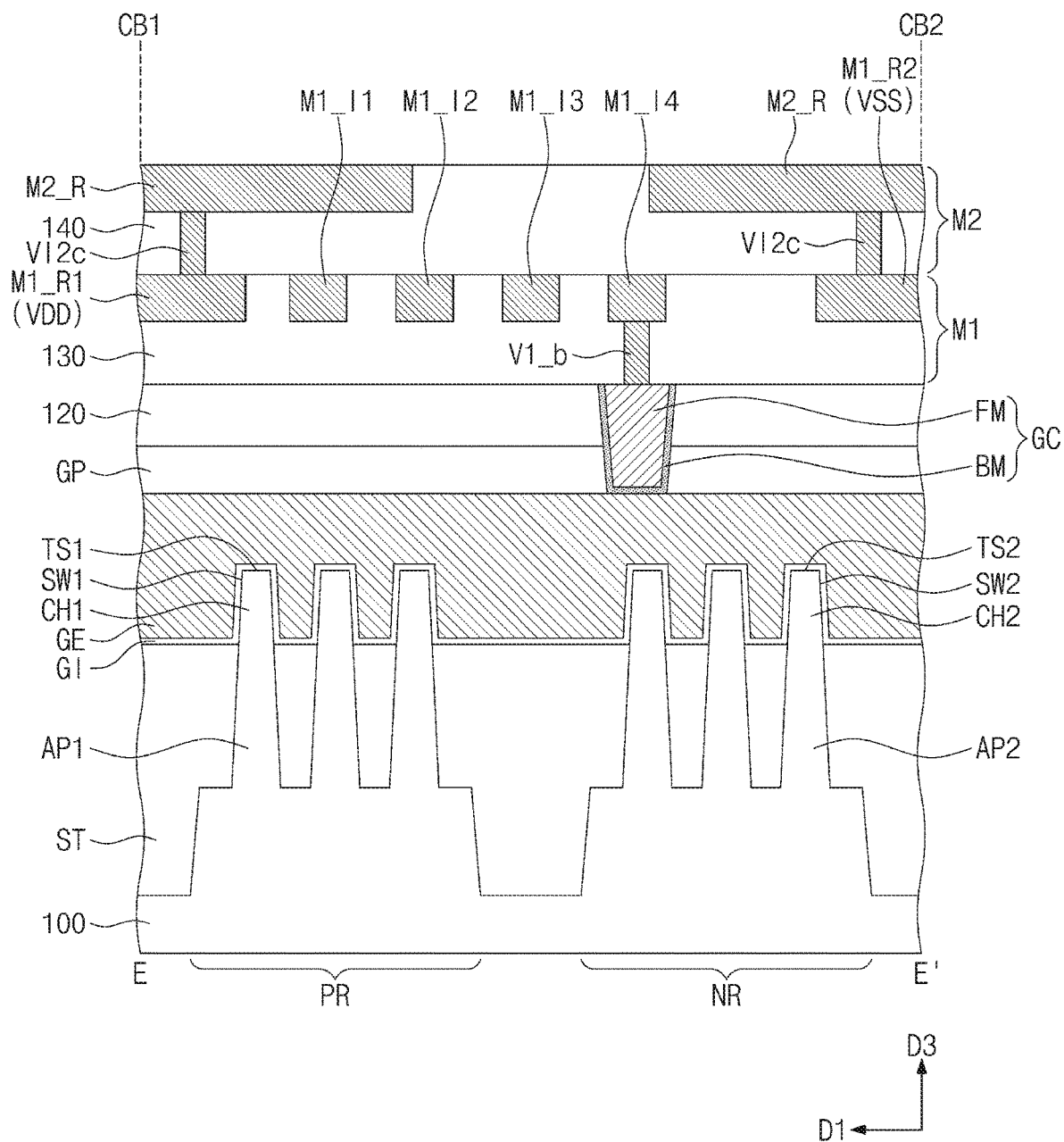

Gate electrodes GE may be provided to cross the first and second active patterns AP1 and AP2 and to extend in the first direction D1, as shown in FIG. 15E. The gate electrodes GE may be arranged with the first pitch P1 and in the second direction D2, as shown in FIG. 14. The gate electrodes GE may be overlapped with the first and second channel patterns CH1 and CH2, when viewed in a plan view. Each of the gate electrodes GE may be provided to face the top surface and opposite side surfaces of each of the first and second channel patterns CH1 and CH2, as shown in FIG. 15E.

Still referring to FIG. 15E, the gate electrode GE may be provided on a first top surface TS1 of the first channel pattern CH1 and at least one first side surface SW1 of the first channel pattern CH1. The gate electrode GE may be provided on a second top surface TS2 of the second channel pattern CH2 and at least one second side surface SW2 of the second channel pattern CH2. In other words, the transistor according to the present embodiment may be a three-dimensional field effect transistor (e.g., FinFET), in which the gate electrode GE is provided to three-dimensionally surround the channel patterns CH1 and CH2.

Referring back to FIG. 14 and FIGS. 15A to 15E, a pair of gate spacers GS may be placed on opposite side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may be a multi-layered structure, which includes at least two different materials selected from SiCN, SiCON, and SiN.

A gate capping pattern GP may be provided on each of the gate electrodes GE, as shown in FIG. 15E. The gate capping pattern GP may be extended along the gate electrode GE in the first direction D1. The gate capping pattern GP may be formed of or include at least one of materials, which have an etch selectivity with respect to first and second interlayer insulating layers 110 and 120 to be described below. In detail, the gate capping patterns GP may be formed of or include at least one of SiON, SiCN, SiCON, or SiN.

A gate dielectric pattern GI may be interposed between the gate electrode GE and the first active pattern AP1 and between the gate electrode GE and the second active pattern AP2, as shown in FIG. 15E. The gate dielectric pattern GI may be extended along a bottom surface of the gate electrode GE thereon. As an example, the gate dielectric pattern GI may cover the first top surface TS1 and the first side surface SW1 of the first channel pattern CH1. The gate dielectric pattern GI may cover the second top surface TS2 and opposite second side surfaces SW2 of the second channel pattern CH2. The gate dielectric pattern GI may cover a top surface of the device isolation layer ST below the gate electrode GE (e.g., see FIG. 15E).

In an embodiment, the gate dielectric pattern GI may be formed of or include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work function metal, which can be used to adjust a threshold voltage of a transistor. By adjusting a thickness and composition of the first metal pattern, it may be possible to realize a transistor having a desired threshold voltage.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metallic material selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS. The second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In an embodiment, each of the first to fourth interlayer insulating layers 110 to 140 may include a silicon oxide layer.

A pair of separation structures DB, which are opposite to each other in the second direction D2, may be provided at both sides of the logic cell LC, as shown in FIG. 14. The separation structure DB may be extended in the first direction D1 and parallel to the gate electrodes GE. A pitch between the separation structure DB and the gate electrode GE, which are adjacent to each other, may be equal to the first pitch P1.

The separation structure DB may be provided to penetrate the first and second interlayer insulating layers 110 and 120 and may be extended in the first and second active patterns AP1 and AP2. The separation structure DB may penetrate an upper portion of each of the first and second active patterns AP1 and AP2. The separation structure DB may separate the first and second active regions PR and NR of the logic cell LC from an active region of a neighboring logic cell.

Active contacts AC may be provided to penetrate the first and second interlayer insulating layers 110 and 120 and may be electrically connected to the first and second source/drain patterns SD1 and SD2, respectively, as shown in FIGS. 15A and 15C. Each of the active contacts AC may be provided between a pair of the gate electrodes GE.

The active contact AC may be a self-aligned contact. For example, the active contact AC may be formed in a self-alignment manner using the gate capping pattern GP and the gate spacer GS. In an embodiment, the active contact AC may cover at least a portion of a side surface of the gate spacer GS. Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal-silicide materials (e.g., titanium silicide, tantalum silicide, tungsten silicide, nickel silicide, and cobalt silicide).

A gate contact GC may be provided to penetrate the second interlayer insulating layer 120 and the gate capping pattern GP and to be electrically connected to the gate electrode GE. As an example, referring to FIG. 15C, a region, which is located on each of the active contacts AC adjacent to the gate contact GC, may be filled with an upper insulating pattern UIP. Accordingly, it may be possible to prevent the gate contact GC from being in contact with the active contact AC adjacent thereto or to prevent a short circuit issue from occurring.

Each of the active and gate contacts AC and GC may include a conductive pattern FM and a barrier pattern BM enclosing the conductive pattern FM. For example, the conductive pattern FM may be formed of or include at least one metallic material selected from the group consisting of aluminum, copper, tungsten, molybdenum, or cobalt. The barrier pattern BM may cover side and bottom surfaces of the conductive pattern FM. The barrier pattern BM may include at least one of a metal layer or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The first metal layer M1 may be provided in the third interlayer insulating layer 130. The first metal layer M1 may include a first lower power line M1_R1, a second lower power line M1_R2, and first to fifth lower interconnection lines M1_I1 to M1_I5, as shown in FIG. 15D.

Each of the first and second lower power lines M1_R1 and M1_R2 may be extended in the second direction D2 to cross the logic cell LC. In detail, the first cell boundary CB1 extending in the second direction D2 may be defined in the logic cell LC. Furthermore, in the logic cell LC, the second cell boundary CB2 may be defined at an opposite side of the first cell boundary CB1. The first lower power line M1_R1 may be placed on the first cell boundary CB1. The first lower power line M1_R1 may be extended along the first cell boundary CB1 and in the second direction D2. The second lower power line M1_R2 may be placed on the second cell boundary CB2. The second lower power line M1_R2 may be extended along the second cell boundary CB2 and in the second direction D2.

The first to fifth lower interconnection lines M1_I1 to M1_I5 may be placed between the first and second lower power lines M1_R1 and M1_R2. The first to fifth lower interconnection lines M1_I1 to M1_I5 may be line- or bar-shaped patterns extending in the second direction D2.

The first to fifth lower interconnection lines M1_I1 to M1_I5 may be arranged with the second pitch P2 and in the first direction D1, as shown in FIG. 14. The second pitch P2 may be smaller than the first pitch P1. The first metal layer M1 may further include first lower vias VI1a and second lower vias VI1b. The first and second lower vias VI1a and VI1b may be provided below the lower interconnection lines.

The first lower via VI1a may be interposed between the active contact AC and the lower interconnection line to electrically connect them to each other. The second lower via VI1b may be interposed between the gate contact GC and the lower interconnection line to electrically connect them to each other.

In detail, the first lower power line M1_R1 may be electrically connected to the active contact AC of the first active region PR through the first lower via VI1a (e.g., see FIG. 15D). The second lower power line M1_R2 may be electrically connected to the active contact AC of the second active region NR through the first lower via VI1a (e.g., see FIG. 15D).

The first lower interconnection line M1_I1 may be electrically connected to the active contact AC through the first lower via VI1a (e.g., see FIG. 15A). The fourth lower interconnection line M1_I4 may be electrically connected to the gate contact GC through the second lower via VI1b (e.g., see FIG. 15C).

As an example, the lower interconnection line and the lower via thereunder may be separately formed by different processes. For example, each of the lower interconnection line and the lower via of the first metal layer M1 may be formed by a single damascene process. The semiconductor device according to the present embodiment may be fabricated using a sub-20 nm process.

The second metal layer M2 may be provided in the fourth interlayer insulating layer 140. The second metal layer M2 may include first and second upper interconnection lines M2_I1 and M2_I2, upper power lines M2_R, and a routing line M2_O, as shown in FIG. 15C. Each of the upper interconnection lines of the second metal layer M2 may be a line- or bar-shaped pattern extending in the first direction D1. In other words, the upper interconnection lines may be extended in the first direction D1 and parallel to each other. When viewed in a plan view, the upper interconnection lines may be parallel to the gate electrodes GE. The upper interconnection lines may be arranged with the third pitch P3 and in the second direction D2. The third pitch P3 may be smaller than the first pitch P1. The third pitch P3 may be larger than the second pitch P2.

Each of the first and second upper interconnection lines M2_I1 and M2_I2 may be extended from the first active region PR to the second active region NR, when viewed in a plan view. Each of the first and second upper interconnection lines M2_I1 and M2_I2 may not be extended to a region outside the first cell boundary CB1. Each of the first and second upper interconnection lines M2_I1 and M2_I2 may not be extended to a region outside the second cell boundary CB2. For example, an end of each of the first and second upper interconnection lines M2_I1 and M2_I2 may be located on the first active region PR, and an opposite end of each of the first and second upper interconnection lines M2_I1 and M2_I2 may be located on the second active region NR. A line width of the first upper interconnection line M2_I1 may be larger than a line width of the second upper interconnection line M2_I2.

The routing line M2_O may be extended beyond the first cell boundary CB1 (FIG. 14) or the second cell boundary CB2. For example, the routing line M2_O may be extended to other logic cell, which is located adjacent to the logic cell LC in the first direction D1. In other words, the routing line M2_O may connect a logic circuit of the logic cell LC with a logic circuit of the adjacent logic cell.

A pair of the upper power lines M2_R may be provided on the gate electrode GE. The pair of the upper power lines M2_R may be placed along the gate electrode GE to be aligned to each other in the first direction D1. In other words, when viewed in a plan view, the pair of the upper power lines M2_R may be overlapped with the gate electrode GE. A first upper power line, which is one of the pair of the upper power lines M2_R may be electrically connected to the first lower power line M1_R1 through a third upper via VI2c, which will be described below. A second upper power line, which is the other of the pair of the upper power lines M2_R may be electrically connected to the second lower power line M1_R2 through the third upper via VI2c (e.g., see FIG. 15E).

The second metal layer M2 may further include first upper vias VI2a, second upper vias VI2b, and third upper vias VI2c. The first to third upper vias VI2a, VI2b, and VI2c may be provided below the upper interconnection lines.

For example, the second upper interconnection line M2_I2 may be electrically connected to the fourth lower interconnection line M1_I4 through the first upper via VI2a (e.g., see FIG. 15C). The first upper interconnection line M2_I1 may be electrically connected to the first lower interconnection line M1_I1 through the second upper via VI2b (e.g., see FIG. 15A). The upper power line M2_R may be electrically connected to the first lower power line M1_R1 through the third upper via VI2c (e.g., see FIG. 15B).

Referring back to FIG. 15A, a width of the second upper via VI2b in the second direction D2 may be larger than a width of the first upper via VI2a in the second direction D2. Referring back to FIG. 15B, a width of the third upper via VI2c in the second direction D2 may be substantially equal to a width of the second upper via VI2b in the second direction D2. In particular, since the third upper via VI2c has a relatively large width, an electric resistance between the upper power line M2_R and the first lower power line M1_R1 may be reduced.

The interconnection line of the first metal layer M1 and the interconnection line of the second metal layer M2 may be formed of or include the same conductive material or of different conductive materials. For example, the interconnection line of the first metal layer M1 and the interconnection line of the second metal layer M2 may be formed of or include at least one metallic material selected from the group consisting of aluminum, copper, tungsten, molybdenum, and cobalt. Although not shown, metal layers may be additionally stacked on the fourth interlayer insulating layer 140. Each of the stacked metal layers may include routing lines.

Figure 16A:
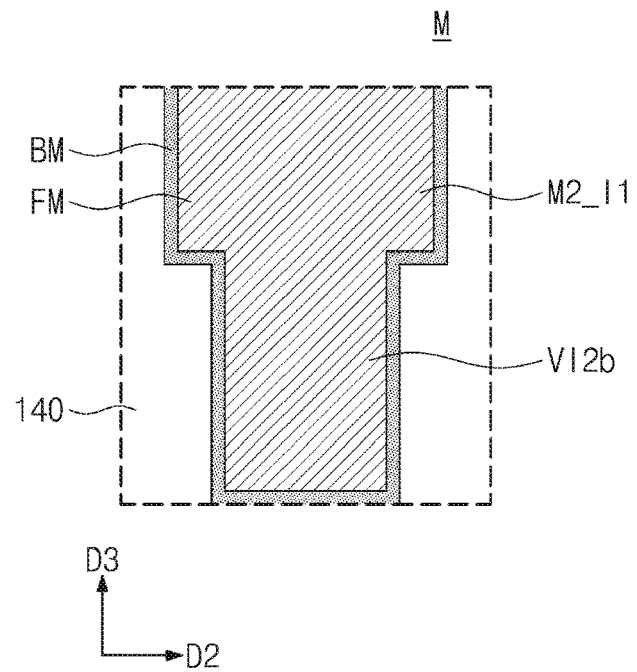
FIGS. 16A and 16B are enlarged sectional views illustrating two portions (e.g., a portion 'M' of FIG. 15A and a portion 'N' of FIG. 15B) of a semiconductor device according to an embodiment of the inventive concept.
Figure 16B:
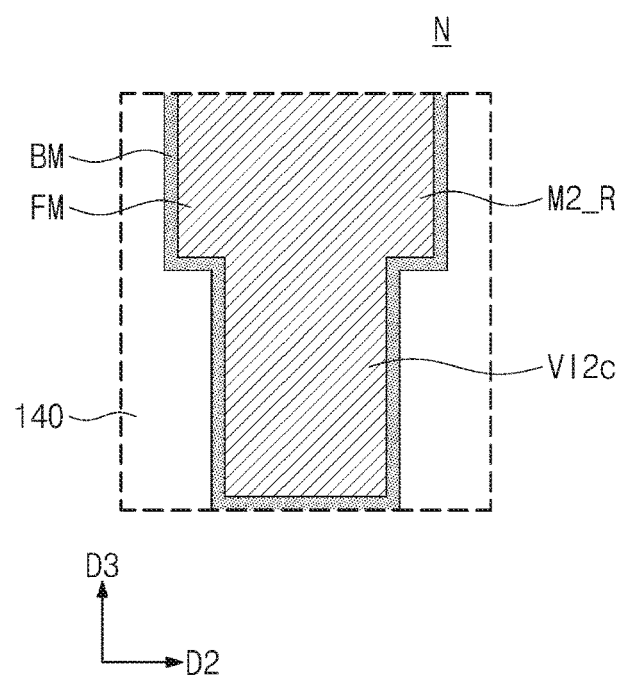

FIGS. 16A and 16B are enlarged sectional views illustrating two portions (e.g., a portion 'M' of FIG. 15A and a portion 'N' of FIG. 15B) of a semiconductor device according to an embodiment of the inventive concept. Referring to FIGS. 16A and 16B, the upper interconnection line and the upper via thereunder of the second metal layer M2 may be a single object formed by the same process. For example, the upper interconnection line and the upper via of the second metal layer M2 may be formed together by a dual damascene process.

In detail, a conductive structure illustrated in FIGS. 16A and 16B may include the conductive pattern FM and the barrier pattern BM enclosing the conductive pattern FM. An upper portion of the conductive structure may be the first upper interconnection line M2_I1, and a lower portion of the conductive structure may be the second upper via VI2b. The barrier pattern BM may not be interposed between the first upper interconnection line M2_I1 and the second upper via VI2b. The conductive structure, which is composed of the upper power line M2_R and the third upper via VI2c, may be substantially the same as the conductive structure composed of the first upper interconnection line M2_I1 and the second upper via VI2b described above.

Figure 17A:
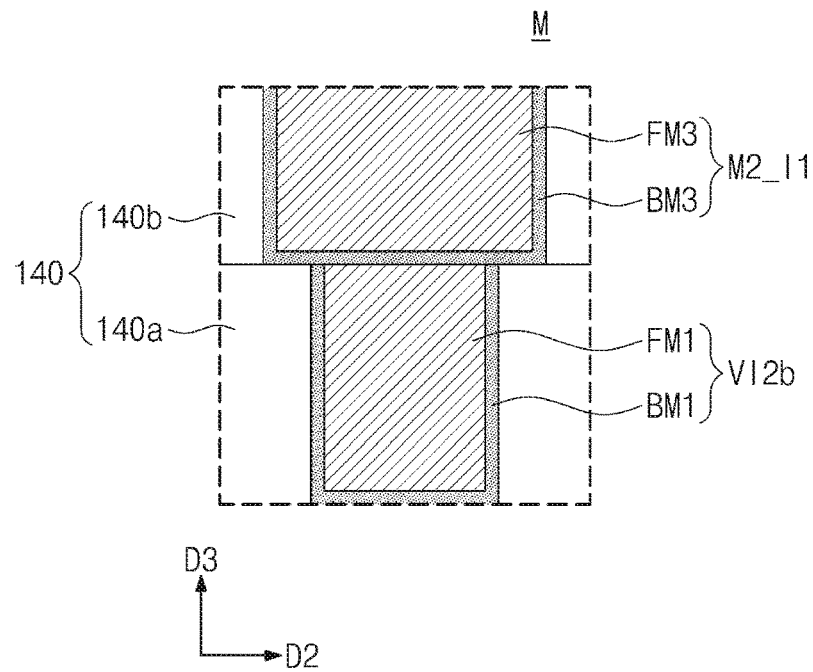
FIGS. 17A and 17B are enlarged sectional views illustrating two portions (e.g., the portion 'M' of FIG. 15A and the portion 'N' of FIG. 15B) of a semiconductor device according to another embodiment of the inventive concept.
Figure 17B:
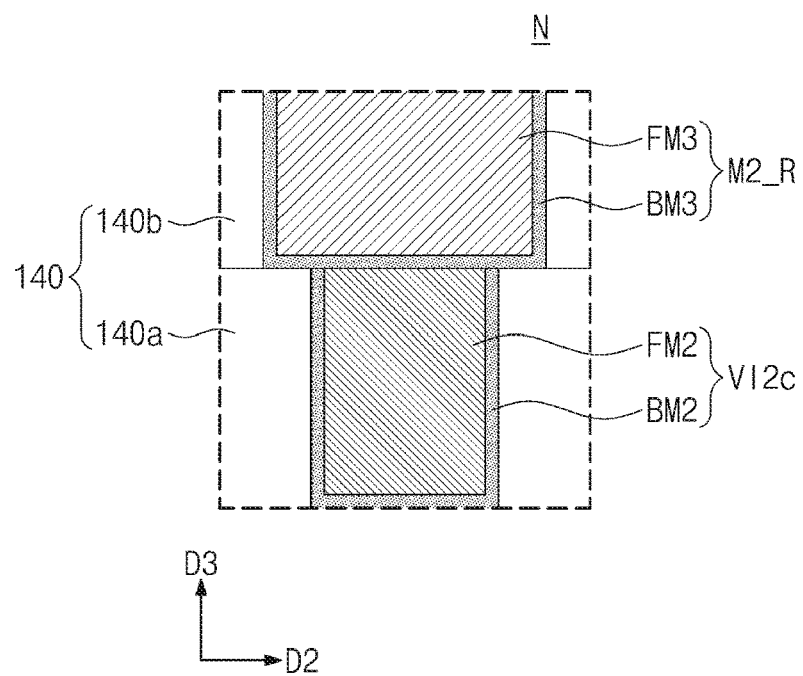

FIGS. 17A and 17B are enlarged sectional views illustrating two portions (e.g., the portion 'M' of FIG. 15A and the portion 'N' of FIG. 15B) of a semiconductor device according to another embodiment of the inventive concept. Referring to FIGS. 17A and 17B, the upper interconnection line and an upper via thereunder of the second metal layer M2 may be formed by a single damascene process, similar to the lower interconnection line and the lower via of the first metal layer M1.

In detail, the fourth interlayer insulating layer 140 may include a lower insulating layer 140a and an upper insulating layer 140b. The second upper via VI2b and the third upper via VI2c may be provided in the lower insulating layer 140a.

The second upper via VI2b may include a first conductive pattern FM1 and a first barrier pattern BM1 enclosing the first conductive pattern FM1. The first conductive pattern FM1 may be a metal layer having the largest volume, among a plurality of metal layers constituting the second upper via VI2b.

The third upper via VI2c may include a second conductive pattern FM2 and a second barrier pattern BM2 enclosing the second conductive pattern FM2. The second conductive pattern FM2 may be a metal layer having the largest volume, among a plurality of metal layers constituting the third upper via VI2c.

The second conductive pattern FM2 of the third upper via VI2c may be formed of or include a metallic material that is different from the first conductive pattern FM1 of the second upper via VI2b. Since the third upper via VI2c is used to deliver a power signal of a semiconductor device, the third upper via VI2c may have electrical resistance that is lower than that of the second upper via VI2b. Thus, the second conductive pattern FM2 may be formed of or include a metallic material whose electrical resistance is lower than that of the first conductive pattern FM1.

The first upper interconnection line M2_I1 and the upper power line M2_R may be provided in the upper insulating layer 140b. Each of the first upper interconnection line M2_I1 and the upper power line M2_R may include a third conductive pattern FM3 and a third barrier pattern BM3 enclosing the third conductive pattern FM3. The third conductive pattern FM3 of the first upper interconnection line M2_I1 may be formed of or include the same metallic material as the third conductive pattern FM3 of the upper power line M2_R.

The third barrier pattern BM3 of the first upper interconnection line M2_I1 may be interposed between the second upper via VI2b and the first upper interconnection line M2_I1. The third barrier pattern BM3 of the upper power line M2_R may be interposed between the third upper via VI2c and the upper power line M2_R.

Figure 18A:
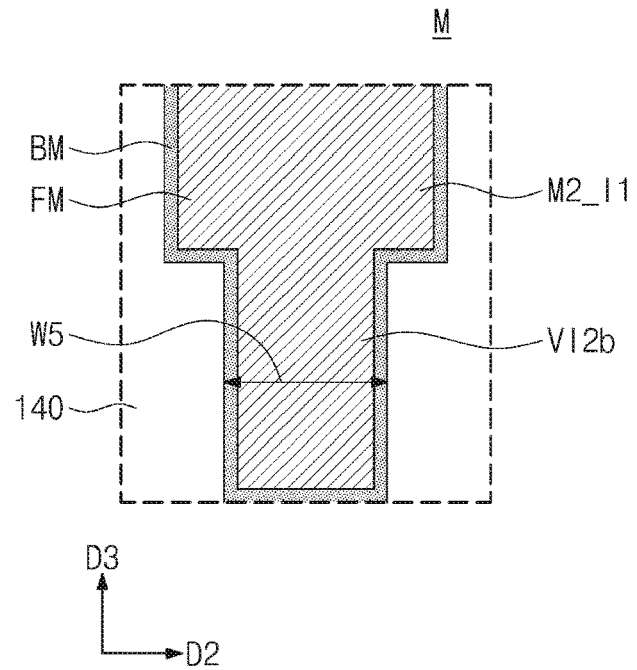
FIGS. 18A and 18B are enlarged sectional views illustrating two portions (e.g., the portion 'M' of FIG. 15A and the portion 'N' of FIG. 15B) of a semiconductor device according to other embodiment of the inventive concept.
Figure 18B:
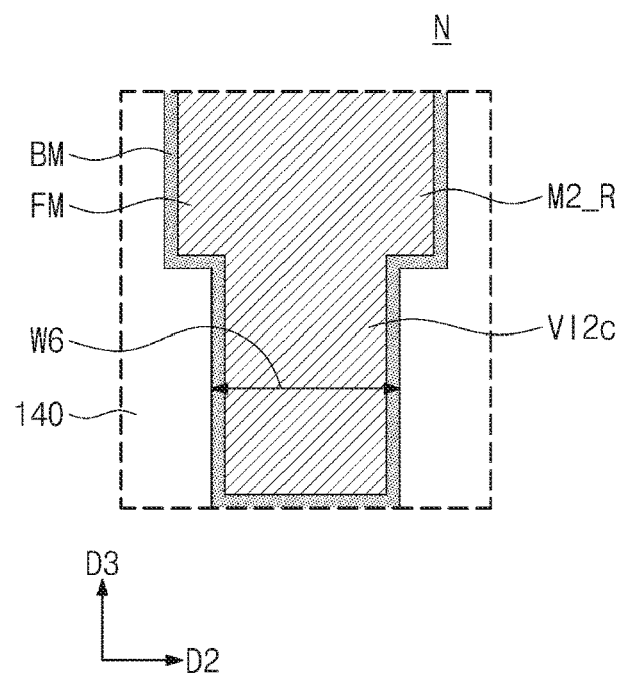

FIGS. 18A and 18B are enlarged sectional views illustrating two portions (e.g., the portion 'M' of FIG. 15A and the portion 'N' of FIG. 15B) of a semiconductor device according to other embodiment of the inventive concept. Referring to FIGS. 18A and 18B, the second upper via VI2b and the third upper via VI2c may be formed to have different widths from each other. For example, the second upper via VI2b may have a fifth width W5 in the second direction D2, and the third upper via VI2c may have a sixth width W6, which is larger than the fifth width W5, in the second direction D2. In other words, the third upper via VI2c may have a size that is larger than that of the second upper via VI2b.

A ratio W6/W5 of the sixth width W6 to the fifth width W5 may range from 1.1 to 2.0. In an embodiment, the ratio W6/W5 of the sixth width W6 to the fifth width W5 may range from 1.1 to 1.5.

Since the third upper via VI2c is used to deliver a power signal of a semiconductor device, the third upper via VI2c may have electrical resistance that is lower than that of the second upper via VI2b. As the width of the third upper via VI2c increases, the electrical resistance of the third upper via VI2c may be lowered.

FIGS. 19A to 19D are sectional views, which are respectively taken along lines A-A', C-C', D-D', and E-E' of FIG. 14 to illustrate a semiconductor device according to an embodiment of the inventive concept. In the following description of the present embodiment, an element previously described with reference to FIG. 14 and FIGS. 15A to 15E may be identified by the same reference number without repeating an overlapping description thereof.

Referring to FIG. 14 and FIGS. 19A to 19D, the substrate 100 including the first and second active regions PR and NR may be provided. The device isolation layer ST may be provided on the substrate 100. The device isolation layer ST may define the first active pattern AP1 and the second active pattern AP2 in an upper portion of the substrate 100. The first active pattern AP1 and the second active pattern AP2 may be defined on the first active region PR and the second active region NR, respectively.

Figure 19A:
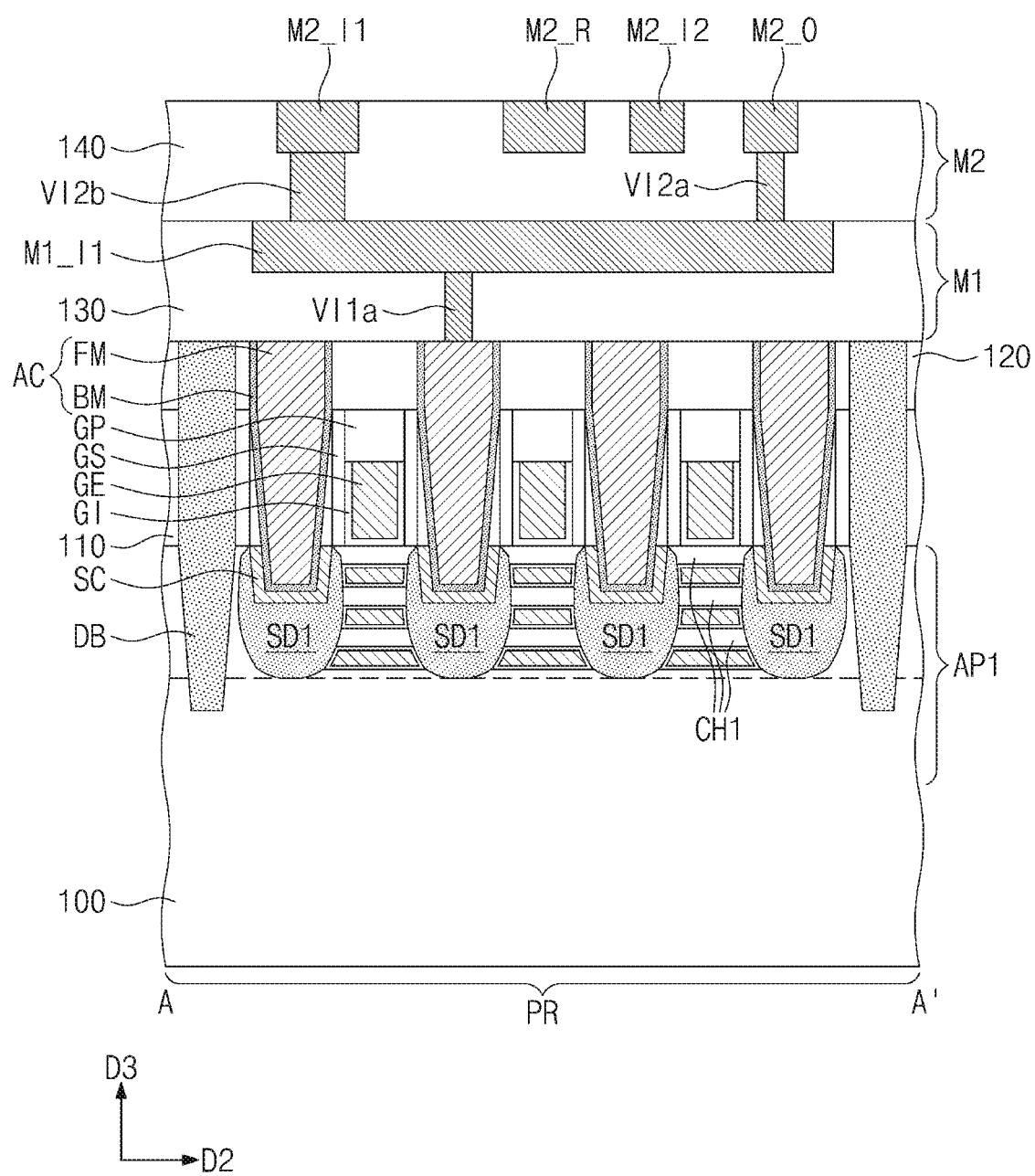
FIGS. 19A to 19D are sectional views, which are respectively taken along lines A-A', C-C', D-D', and E-E' of FIG. 14 to illustrate a semiconductor device according to an embodiment of the inventive concept.
Figure 19B:
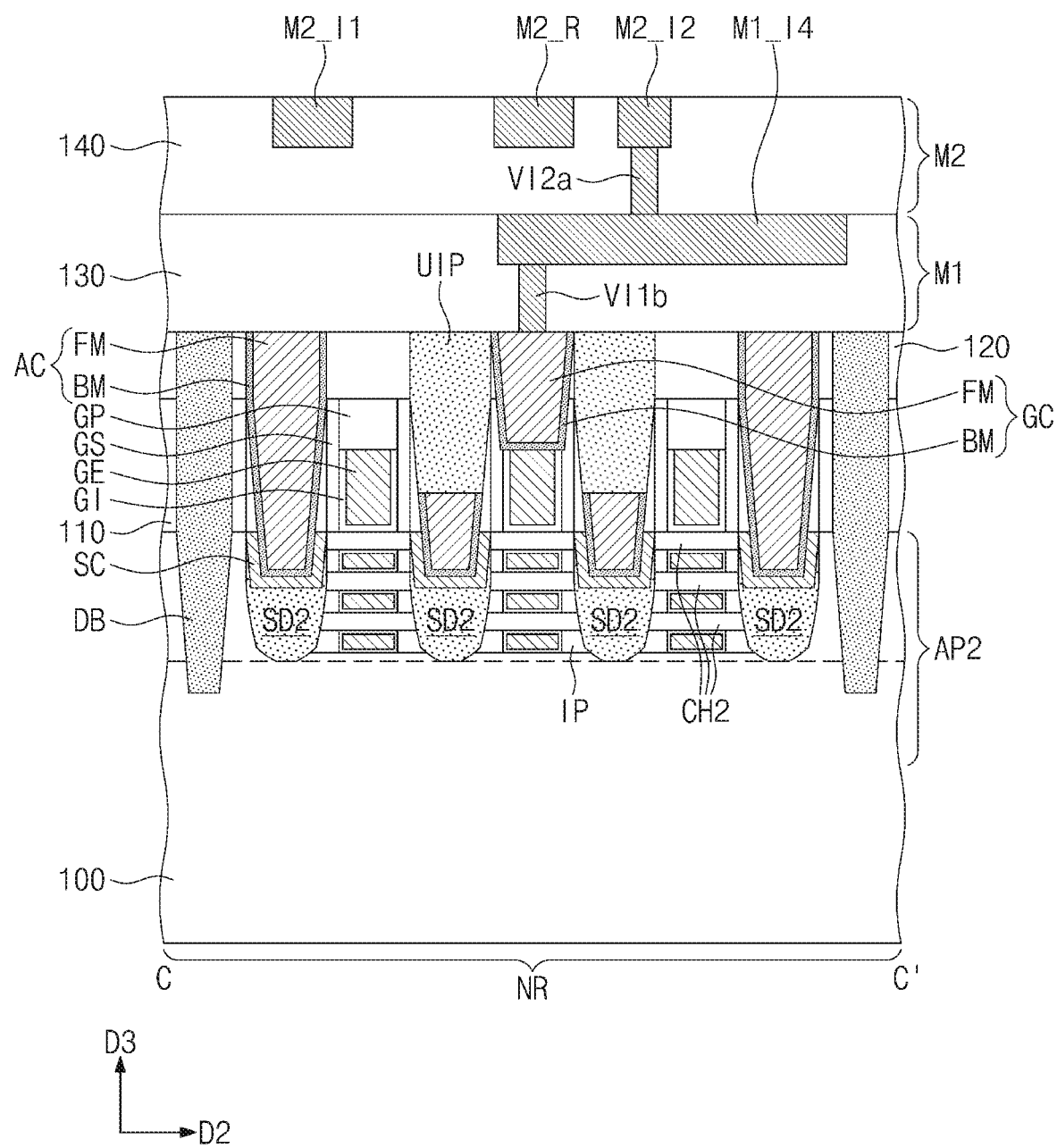
Figure 19C:
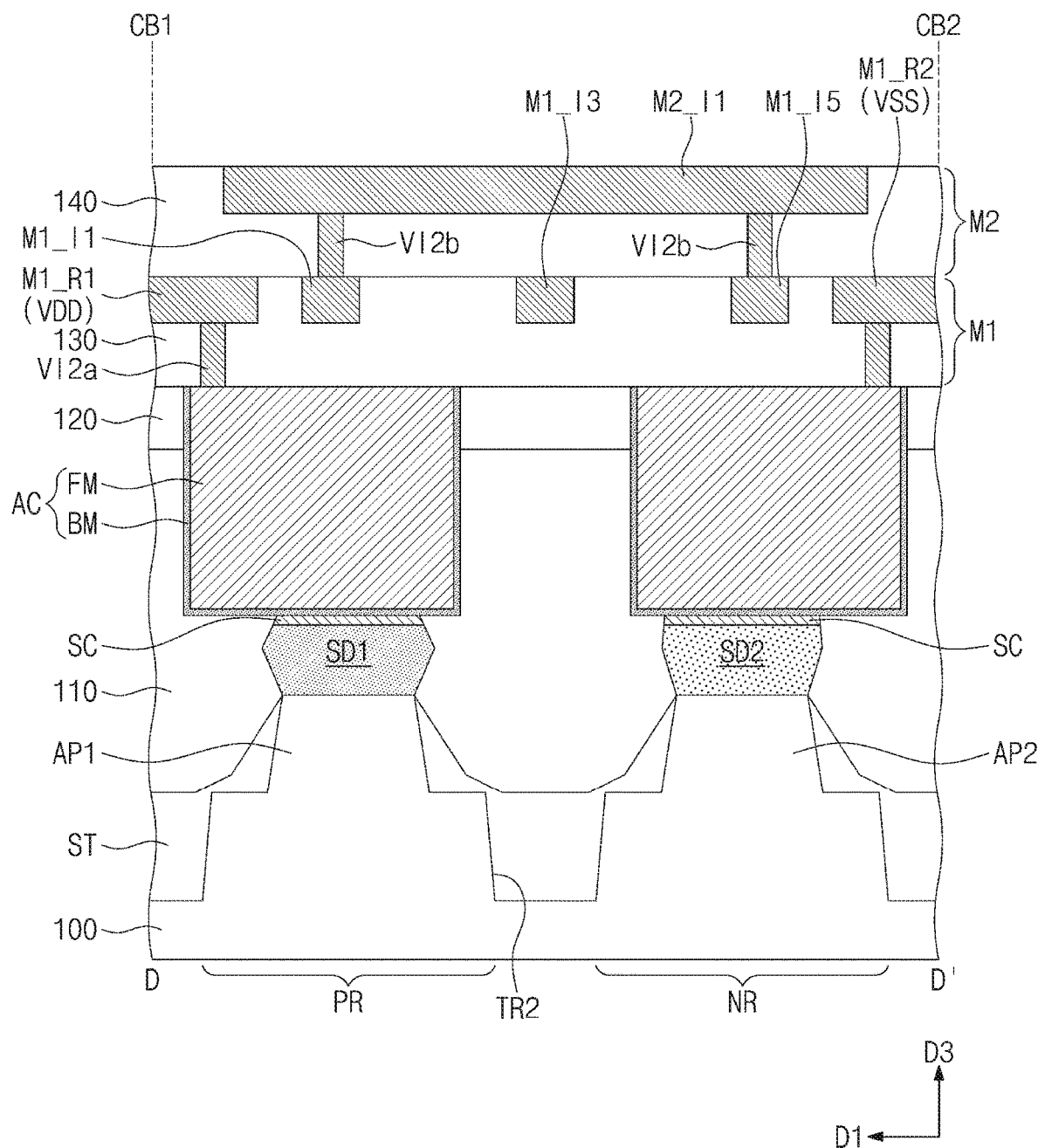
Figure 19D:
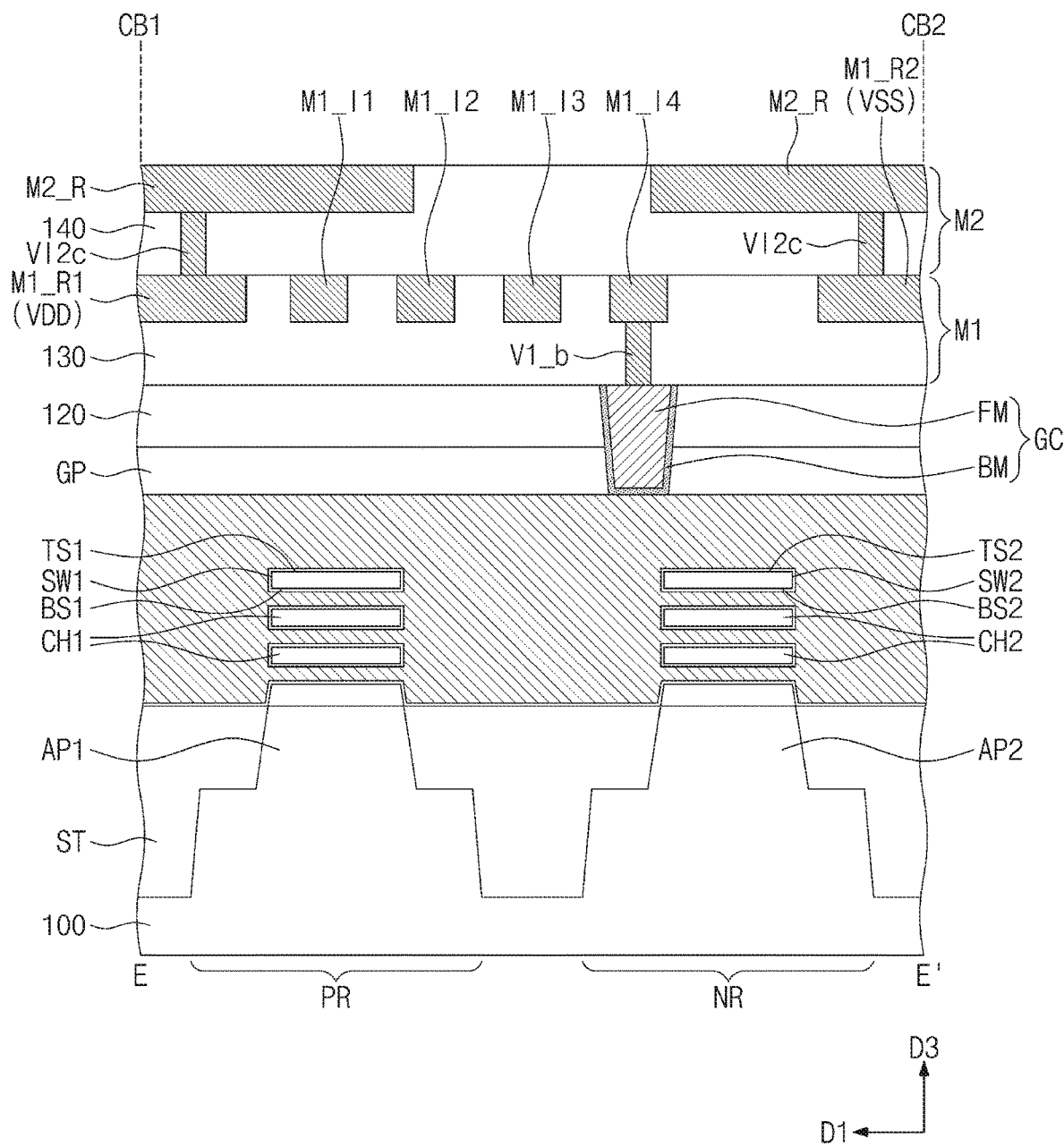

The first active pattern AP1 may include first channel patterns CH1, which are vertically stacked, as shown in FIG. 19D. The stacked first channel patterns CH1 may be spaced apart from each other in a third direction D3. The stacked first channel patterns CH1 may be overlapped with each other, when viewed in a plan view. The second active pattern AP2 may include second channel patterns CH2, which are vertically stacked, as shown in FIG. 19D. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of or include at least one of silicon (Si), germanium (Ge), and silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect an adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect an adjacent pair of the second source/drain patterns SD2 to each other.

The gate electrodes GE may be provided to cross the first and second channel patterns CH1 and CH2 and to extend in the first direction D1. The gate electrode GE may be overlapped with the first and second channel patterns CH1 and CH2, when viewed in a plan view. A pair of the gate spacers GS may be placed on opposite side surfaces of the gate electrode GE. The gate capping pattern GP may be provided on the gate electrode GE.

The gate electrode GE may surround each of the first and second channel patterns CH1 and CH2 (e.g., see FIG. 19D). The gate electrode GE may be provided on the first top surface TS1, the at least one first side surface SW1, and a first bottom surface BS1 of the first channel pattern CH1. The gate electrode GE may be provided on the second top surface TS2, the at least one second side surface SW2, and a second bottom surface BS2 of the second channel pattern CH2. In other words, the gate electrode GE may be provided to face or surround top, bottom, and opposite side surfaces of each of the first and second channel patterns CH1 and CH2. A transistor according to the present embodiment may be a three-dimensional field-effect transistor (e.g., multi-bridge channel field-effect transistor (MBCFET)), in which the gate electrode GE is provided to three-dimensionally surround the channel patterns CH1 and CH2.

The gate dielectric pattern GI may be provided between each of the first and second channel patterns CH1 and CH2 and the gate electrode GE. The gate dielectric pattern GI may surround each of the first and second channel patterns CH1 and CH2.

An insulating pattern IP may be provided on the second active region NR to be interposed between the gate dielectric pattern GI and the second source/drain pattern SD2. The gate electrode GE may be spaced apart from the second source/drain pattern SD2 by the gate dielectric pattern GI and the insulating pattern IP. However, the insulating pattern IP may not be provided on the first active region PR.

The first interlayer insulating layer 110 and the second interlayer insulating layer 120 may be provided on the entire top surface of the substrate 100. The active contacts AC may be provided to penetrate the first and second interlayer insulating layers 110 and 120 and may be connected to the first and second source/drain patterns SD1 and SD2, respectively. The gate contact GC may be provided to penetrate the second interlayer insulating layer 120 and the gate capping pattern GP and may be electrically connected to the gate electrode GE.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first metal layer M1 and the second metal layer M2 may be configured to have substantially the same features as those described with reference to FIGS. 14 and 15A to 15E.

In a method of designing a semiconductor device according to an embodiment of the inventive concept, a step of resizing a power via pattern may be further performed during a step of placing and routing standard cells. Due to the change in size of the power via pattern, the power via pattern may be differentiated from other via patterns, and this may allow a placement and routing tool to apply a specific design rule to the power via pattern. That is, according to an embodiment of the inventive concept, it may be possible to prevent a process failure and consequently to improve reliability characteristics of the semiconductor device. Furthermore, it may be possible to reduce a connection resistance between an upper power line and a lower power line and thereby to improve electric characteristics of the semiconductor device.

While example embodiments of the inventive concept have been particularly shown and described, it will be understood by one of ordinary skill in the art that variations in form and detail may be made therein without departing from the scope of the attached claims.

What is claimed is:

1. A method of fabricating a semiconductor device, comprising:
    placing a standard cell, wherein the standard cell comprises:
        a first lower interconnection pattern, a second lower interconnection pattern, and a lower power pattern;
        a first upper interconnection pattern, a second upper interconnection pattern, and an upper power pattern;
        a first via pattern between the first lower interconnection pattern and the first upper interconnection pattern;
        a second via pattern between the second lower interconnection pattern and the second upper interconnection pattern, wherein a width of the second via pattern is larger than a width of the first via pattern; and
        a third via pattern between the lower power pattern and the upper power pattern, wherein a first width of the third via pattern and the width of the second via pattern are the same,
    resizing the third via pattern to have a second width different from the width of the second via pattern; and
    applying different design rules to the second via pattern and the third via pattern, respectively, to perform a routing operation on the standard cell.

2. The method of claim 1, further comprising restoring a size and shape of the third via pattern to its original size and shape if a result of the routing operation on the standard cell satisfies a design rule for the third via pattern, wherein the original size and shape of the third via pattern is the same as a size and shape of the second via pattern.

3. The method of claim 1, wherein the second width of the third via pattern is larger than the width of the second via pattern.

4. The method of claim 1, wherein the second width of the third via pattern is smaller than the width of the second via pattern.

5. The method of claim 1, wherein the performing of the routing operation on the standard cell comprises:
placing a routing line pattern connecting the standard cell to another standard cell; and
placing a fourth via pattern between the second lower interconnection pattern and the routing line pattern.

6. The method of claim 5, further comprising checking design rules on geometrical features between the fourth via pattern and the second via pattern and between the fourth via pattern and the third via pattern.

7. The method of claim 6, wherein a minimum distance between the fourth via pattern and the third via pattern is larger than a minimum distance between the fourth via pattern and the second via pattern.

8. The method of claim 1, further comprising placing gate patterns and the upper power pattern, before the placing of the standard cell,
wherein the standard cell is placed on the gate patterns and the upper power pattern so as to overlap the gate patterns and the upper power pattern.

9. The method of claim 1, wherein a line width of the second upper interconnection pattern is larger than a line width of the first upper interconnection pattern, and
wherein a line width of the upper power pattern is larger than the line width of the first upper interconnection pattern.

10. The method of claim 1, further comprising:
performing an optical proximity correction on a layout on which the routing operation has been performed;
generating a photomask, based on the layout on which the optical proximity correction has been performed; and
performing a semiconductor fabrication process on a substrate using the photomask.

11. A method of fabricating a semiconductor device, comprising:
placing an upper power pattern;
placing a standard cell on the upper power pattern;
placing a power via pattern between the upper power pattern and a lower power pattern of the standard cell;
resizing the power via pattern to differentiate the power via pattern from another via pattern of the semiconductor device; and
performing a routing operation on the standard cell.

12. The method of claim 11, further comprising:
performing an optical proximity correction on a layout on which the routing operation has been performed;
generating a photomask, based on the layout on which the optical proximity correction has been performed; and
performing a semiconductor fabrication process on a substrate using the photomask.

13. The method of claim 11, further comprising restoring a size and shape of the power via pattern to its original size and shape if a result of the routing operation on the standard cell satisfies a design rule for the power via pattern.

14. The method of claim 11, wherein the resizing of the power via pattern comprises increasing or decreasing a width of the power via pattern.

15. The method of claim 11, further comprising checking a design rule after the routing operation.

16. A method of fabricating a semiconductor device, comprising:
placing a standard cell, wherein the standard cell comprises:
a first lower interconnection pattern, a second lower interconnection pattern, and a lower power pattern;
a first upper interconnection pattern, a second upper interconnection pattern, and an upper power pattern, wherein a width of each of the lower power pattern and the upper power pattern is larger than a line width of each of the first lower interconnection pattern and the second lower interconnection pattern;
a first via pattern between the first lower interconnection pattern and the first upper interconnection pattern;
a second via pattern between the second lower interconnection pattern and the second upper interconnection pattern, wherein a width of the second via pattern is larger than a width of the first via pattern; and
a third via pattern between the lower power pattern and the upper power pattern, wherein a first width of the third via pattern and the width of the second via pattern are the same.

17. The method of claim 16, further comprising resizing the third via pattern to have a second width different from the width of the second via pattern.

18. The method of claim 17, wherein the second width of the third via pattern is larger than the width of the second via pattern.

19. The method of claim 17, wherein the second width of the third via pattern is smaller than the width of the second via pattern.

20. The method of claim 16, wherein a line width of the second upper interconnection pattern is larger than a line width of the first upper interconnection pattern, and
wherein a line width of the upper power pattern is larger than the line width of the first upper interconnection pattern.

* * * * *